US012776476B2

(12) United States Patent
Miller et al.

(10) Patent No.: US 12,776,476 B2
(45) Date of Patent: Oct. 27, 2026

(54) PULSING POWER SUPPLY WITH POWERED CROWBAR

(71) Applicant: EHT Ventures LLC, Seattle, WA (US)

(72) Inventors: Kenneth Miller, Seattle, WA (US); Alex Henson, Seattle, WA (US); James Prager, Seattle, WA (US); Jacob Hagen, Seattle, WA (US)

(73) Assignee: EHT Ventures LLC, Seattle, WA (US)

( * ) Notice: Subject to any disclaimer, the term of this patent is extended or adjusted under 35 U.S.C. 154(b) by 439 days.

(21) Appl. No.: 18/440,956

(22) Filed: Feb. 13, 2024

(65) Prior Publication Data

US 2024/0282552 A1 Aug. 22, 2024

Related U.S. Application Data

(60) Provisional application No. 63/485,536, filed on Feb. 17, 2023.

(51) Int. Cl.
*H01J 37/32* (2006.01)

(52) U.S. Cl.
CPC .. *H01J 37/32146* (2013.01); *H01J 37/32027* (2013.01); *H01J 37/32155* (2013.01); *H01J 37/32577* (2013.01)

(58) Field of Classification Search
CPC ........... H01J 37/32146; H01J 37/32027; H01J 37/32155; H01J 37/32577
See application file for complete search history.

(56) References Cited

U.S. PATENT DOCUMENTS

| | | | |
|---|---|---|---|
| 3,339,108 | A | 8/1967 | Holtje |
| 4,070,589 | A | 1/1978 | Martinkovic |
| 4,076,996 | A | 2/1978 | Maehara et al. |
| 4,438,331 | A | 3/1984 | Davis |
| 4,504,895 | A | 3/1985 | Steigerwald |
| 4,692,851 | A | 9/1987 | Attwood |
| 4,885,074 | A | 12/1989 | Susko et al. |
| 4,924,191 | A | 5/1990 | Erb et al. |

(Continued)

FOREIGN PATENT DOCUMENTS

| | | | |
|---|---|---|---|
| CA | 2292526 | A1 | 12/1999 |
| CN | 101534071 | A | 9/2009 |

(Continued)

OTHER PUBLICATIONS

Extended European Search Report in EP Application No. 21838456.8, mailed on Jul. 3, 2024, 9 pages.

(Continued)

*Primary Examiner* — Daniel D Chang

(57) ABSTRACT

A pulsing power supply is disclosed. The pulsing power supply includes a pulser having an output that outputs pulses greater than 5 kV with a pulse repetition frequency greater than 10 kHz; a powered crowbar circuit electrically coupled across the output, the powered crowbar circuit including a DC source, wherein a polarity of the DC power supply is arranged opposite a polarity of the pulser; a transformer having a primary side and a secondary side, the primary side of the transformer is electrically coupled across the output of the pulser and across the powered crowbar circuit; and a plurality of electrodes electrically coupled with the secondary-side of the transformer.

24 Claims, 10 Drawing Sheets

(56) References Cited

U.S. PATENT DOCUMENTS

| | | | |
|---|---|---|---|
| 4,992,919 | A | 2/1991 | Lee et al. |
| 5,038,051 | A | 8/1991 | Firman et al. |
| 5,072,191 | A | 12/1991 | Nakajima et al. |
| 5,118,969 | A | 6/1992 | Ikezi et al. |
| 5,140,510 | A | 8/1992 | Myers |
| 5,313,481 | A | 5/1994 | Cook et al. |
| 5,321,597 | A | 6/1994 | Alacoque |
| 5,325,021 | A | 6/1994 | Duckworth et al. |
| 5,392,043 | A | 2/1995 | Ribner |
| 5,392,187 | A | 2/1995 | Baliga |
| 5,418,707 | A | 5/1995 | Shimer et al. |
| 5,451,846 | A | 9/1995 | Peterson et al. |
| 5,483,731 | A | 1/1996 | Prendel et al. |
| 5,488,552 | A | 1/1996 | Sakamoto et al. |
| 5,610,452 | A | 3/1997 | Shimer et al. |
| 5,623,171 | A | 4/1997 | Nakajima |
| 5,629,844 | A | 5/1997 | Krichtafovitch et al. |
| 5,656,123 | A | 8/1997 | Salimian et al. |
| 5,729,562 | A | 3/1998 | Birx et al. |
| 5,796,598 | A | 8/1998 | Nowak et al. |
| 5,808,504 | A | 9/1998 | Chikai et al. |
| 5,895,558 | A | 4/1999 | Spence |
| 5,905,646 | A | 5/1999 | Crewson et al. |
| 5,930,125 | A | 7/1999 | Hitchcock et al. |
| 5,933,335 | A | 8/1999 | Hitchcock et al. |
| 5,947,300 | A | 9/1999 | Lange |
| 5,968,377 | A | 10/1999 | Yuasa et al. |
| 6,059,935 | A | 5/2000 | Spence |
| 6,066,901 | A | 5/2000 | Burkhart et al. |
| 6,087,871 | A | 7/2000 | Kardo-Syssoev et al. |
| 6,205,074 | B1 | 3/2001 | Van Buskirk et al. |
| 6,222,321 | B1 | 4/2001 | Scholl et al. |
| 6,233,161 | B1 | 5/2001 | Balakrishnan et al. |
| 6,238,387 | B1 | 5/2001 | Miller, III |
| 6,239,403 | B1 | 5/2001 | Dible et al. |
| 6,252,354 | B1 | 6/2001 | Collins et al. |
| 6,253,704 | B1 | 7/2001 | Savas |
| 6,300,720 | B1 | 10/2001 | Birx |
| 6,359,542 | B1 | 3/2002 | Widmayer et al. |
| 6,362,604 | B1 | 3/2002 | Cravey |
| 6,392,187 | B1 | 5/2002 | Johnson |
| 6,416,638 | B1 | 7/2002 | Kuriyama et al. |
| 6,480,399 | B2 | 11/2002 | Balakrishnan et al. |
| 6,483,731 | B1 * | 11/2002 | Isurin ...................... H02M 7/06 363/125 |
| 6,496,047 | B1 | 12/2002 | Iskander et al. |
| 6,518,195 | B1 | 2/2003 | Collins et al. |
| 6,577,135 | B1 | 6/2003 | Matthews et al. |
| 6,741,120 | B1 | 5/2004 | Tan |
| 6,741,484 | B2 | 5/2004 | Crewson et al. |
| 6,815,633 | B1 | 11/2004 | Chen et al. |
| 6,831,377 | B2 | 12/2004 | Yampolsky et al. |
| 6,897,574 | B2 | 5/2005 | Vaysse |
| 6,947,300 | B2 | 9/2005 | Pai et al. |
| 7,061,230 | B2 | 6/2006 | Kleine et al. |
| 7,180,082 | B1 | 2/2007 | Hassanein et al. |
| 7,256,637 | B2 | 8/2007 | Iskander et al. |
| 7,291,545 | B2 | 11/2007 | Collins et al. |
| 7,307,375 | B2 | 12/2007 | Smith et al. |
| 7,319,579 | B2 | 1/2008 | Inoue et al. |
| 7,354,501 | B2 | 4/2008 | Gondhalekar et al. |
| 7,393,765 | B2 | 7/2008 | Hanawa et al. |
| 7,396,746 | B2 | 7/2008 | Walther et al. |
| 7,492,138 | B2 | 2/2009 | Zhang et al. |
| 7,512,433 | B2 | 3/2009 | Bernhart et al. |
| 7,521,370 | B2 | 4/2009 | Hoffman |
| 7,549,461 | B2 | 6/2009 | Kroliczek et al. |
| 7,601,619 | B2 | 10/2009 | Okumura et al. |
| 7,605,385 | B2 | 10/2009 | Bauer |
| 7,615,931 | B2 | 11/2009 | Hooke et al. |
| 7,767,433 | B2 | 8/2010 | Kuthi et al. |
| 7,901,930 | B2 | 3/2011 | Kuthi et al. |
| 7,936,544 | B2 | 5/2011 | Beland |
| 7,943,006 | B2 | 5/2011 | Hoffman |
| 7,948,185 | B2 | 5/2011 | Smith et al. |
| 7,989,987 | B2 | 8/2011 | McDonald |
| 8,093,797 | B2 | 1/2012 | Tyldesley |
| 8,093,979 | B2 | 1/2012 | Wilson |
| 8,115,343 | B2 | 2/2012 | Sanders et al. |
| 8,120,207 | B2 | 2/2012 | Sanders et al. |
| 8,129,653 | B2 | 3/2012 | Kirchmeier et al. |
| 8,143,790 | B2 | 3/2012 | Smith et al. |
| 8,222,936 | B2 | 7/2012 | Friedman et al. |
| 8,259,476 | B2 | 9/2012 | Ben-Yaakov et al. |
| 8,410,889 | B2 | 4/2013 | Garrity et al. |
| 8,436,602 | B2 | 5/2013 | Sykes |
| 8,450,985 | B2 | 5/2013 | Gray et al. |
| 8,471,642 | B2 | 6/2013 | Hill |
| 8,575,843 | B2 | 11/2013 | Moore et al. |
| 8,723,591 | B2 | 5/2014 | Lee et al. |
| 8,773,184 | B1 | 7/2014 | Petrov et al. |
| 8,828,254 | B2 | 9/2014 | Inoue et al. |
| 8,847,433 | B2 | 9/2014 | Vandermey |
| 8,963,377 | B2 | 2/2015 | Ziemba et al. |
| 9,067,788 | B1 | 6/2015 | Spielman et al. |
| 9,070,396 | B1 | 6/2015 | Katchmart et al. |
| 9,084,334 | B1 | 7/2015 | Gefter et al. |
| 9,122,350 | B2 | 9/2015 | Kao et al. |
| 9,122,360 | B2 | 9/2015 | Xu et al. |
| 9,155,590 | B2 | 10/2015 | Mathur |
| 9,287,086 | B2 | 3/2016 | Brouk et al. |
| 9,287,092 | B2 | 3/2016 | Brouk et al. |
| 9,306,533 | B1 | 4/2016 | Mavretic |
| 9,329,256 | B2 | 5/2016 | Dolce |
| 9,349,603 | B2 | 5/2016 | Inoue et al. |
| 9,417,739 | B2 | 8/2016 | Cordeiro et al. |
| 9,435,029 | B2 | 9/2016 | Brouk et al. |
| 9,493,765 | B2 | 11/2016 | Krishnaswamy et al. |
| 9,515,633 | B1 | 12/2016 | Long et al. |
| 9,601,283 | B2 | 3/2017 | Ziemba et al. |
| 9,655,221 | B2 | 5/2017 | Ziemba et al. |
| 9,706,630 | B2 | 7/2017 | Miller et al. |
| 9,729,122 | B2 | 8/2017 | Mavretic |
| 9,767,988 | B2 | 9/2017 | Brouk et al. |
| 9,811,119 | B2 | 11/2017 | Seo |
| 9,881,772 | B2 | 1/2018 | Marakhatanov et al. |
| 9,960,763 | B2 | 5/2018 | Miller et al. |
| 9,966,231 | B2 | 5/2018 | Boswell et al. |
| 10,009,024 | B2 | 6/2018 | Gan et al. |
| 10,020,800 | B2 | 7/2018 | Prager et al. |
| 10,027,314 | B2 | 7/2018 | Prager et al. |
| 10,044,278 | B2 | 8/2018 | Kondo et al. |
| 10,217,608 | B2 | 2/2019 | Mavretic |
| 10,224,822 | B2 | 3/2019 | Miller et al. |
| 10,301,587 | B2 | 5/2019 | Krishnaswamy et al. |
| 10,304,661 | B2 | 5/2019 | Ziemba et al. |
| 10,373,755 | B2 | 8/2019 | Prager et al. |
| 10,373,804 | B2 | 8/2019 | Koh et al. |
| 10,381,949 | B2 | 8/2019 | Hamerski et al. |
| 10,382,022 | B2 | 8/2019 | Prager et al. |
| 10,448,494 | B1 | 10/2019 | Dorf et al. |
| 10,448,495 | B1 | 10/2019 | Dorf et al. |
| 10,460,910 | B2 | 10/2019 | Ziemba et al. |
| 10,460,911 | B2 | 10/2019 | Ziemba et al. |
| 10,483,089 | B2 | 11/2019 | Ziemba et al. |
| 10,483,090 | B2 | 11/2019 | Bhutta et al. |
| 10,510,575 | B2 | 12/2019 | Kraus et al. |
| 10,555,412 | B2 | 2/2020 | Dorf et al. |
| 10,600,619 | B2 | 3/2020 | Inoue et al. |
| 10,607,814 | B2 | 3/2020 | Ziemba et al. |
| 10,631,395 | B2 | 4/2020 | Sanders et al. |
| 10,659,019 | B2 | 5/2020 | Slobodov et al. |
| 10,707,864 | B2 | 7/2020 | Miller et al. |
| 10,734,906 | B2 | 8/2020 | Miller et al. |
| 10,777,388 | B2 | 9/2020 | Ziemba et al. |
| 10,791,617 | B2 | 9/2020 | Dorf et al. |
| 10,796,887 | B2 | 10/2020 | Prager et al. |
| 10,804,886 | B2 | 10/2020 | Miller et al. |
| 10,811,230 | B2 | 10/2020 | Ziemba et al. |
| 10,876,241 | B2 | 12/2020 | Hu et al. |
| 10,892,140 | B2 | 1/2021 | Ziemba et al. |
| 10,892,141 | B2 | 1/2021 | Ziemba et al. |
| 10,896,809 | B2 | 1/2021 | Ziemba et al. |
| 10,903,047 | B2 | 1/2021 | Ziemba et al. |

(56) References Cited

U.S. PATENT DOCUMENTS 10,916,408 B2 2/2021 Dorf et al.
10,978,955 B2 * 4/2021 Ziemba .................... H03H 7/01
10,978,995 B2 4/2021 Itasaka et al.
10,985,740 B2 4/2021 Prager et al.
10,991,553 B2 4/2021 Ziemba et al.
11,004,660 B2 5/2021 Prager et al.
11,101,108 B2 8/2021 Slobodov et al.
11,171,568 B2 11/2021 Miller et al.
11,222,767 B2 1/2022 Ziemba et al.
11,284,500 B2 3/2022 Dorf et al.
11,350,495 B2 5/2022 Chen et al.
11,404,246 B2 8/2022 Ziemba et al.
11,404,247 B2 8/2022 Bowman et al.
11,476,145 B2 10/2022 Rogers et al.
11,689,107 B2 6/2023 Ziemba et al.
11,690,671 B1 7/2023 Mickelsen
11,725,138 B2 8/2023 Kim et al.
11,810,761 B2 11/2023 Slobodov et al.
11,824,542 B1 11/2023 Henson et al.
11,883,666 B2 1/2024 Swoyer
2001/0008552 A1 7/2001 Harada et al.
2001/0033500 A1 10/2001 Hummert et al.
2002/0016617 A1 2/2002 Oldham
2002/0140464 A1 10/2002 Yampolsky et al.
2002/0180276 A1 12/2002 Sakuma et al.
2002/0186577 A1 12/2002 Kirbie
2003/0021125 A1 1/2003 Rufer et al.
2003/0021131 A1 1/2003 Nadot et al.
2003/0054647 A1 3/2003 Suemasa et al.
2003/0071035 A1 4/2003 Brailove
2003/0137791 A1 7/2003 Arnet et al.
2003/0169107 A1 9/2003 LeChevalier
2003/0227280 A1 12/2003 Vinciarelli
2004/0085784 A1 5/2004 Salama et al.
2004/0149217 A1 8/2004 Collins et al.
2004/0263412 A1 12/2004 Pribyl
2004/0264521 A1 12/2004 Ness et al.
2005/0152159 A1 7/2005 Isurin et al.
2005/0184669 A1 8/2005 Chistyakov
2005/0270096 A1 12/2005 Coleman
2006/0018074 A1 1/2006 Inoue et al.
2006/0048894 A1 3/2006 Yamazaki et al.
2006/0187607 A1 8/2006 Mo
2006/0192774 A1 8/2006 Yasumura
2006/0210020 A1 9/2006 Takahashi et al.
2006/0274887 A1 12/2006 Sakamoto et al.
2007/0018504 A1 1/2007 Wiener et al.
2007/0114981 A1 5/2007 Vasquez et al.
2007/0115705 A1 5/2007 Gotzenberger et al.
2007/0212811 A1 9/2007 Hanawa et al.
2007/0235412 A1 10/2007 Fischer
2008/0062733 A1 3/2008 Gay
2008/0106151 A1 5/2008 Ryoo et al.
2008/0143260 A1 6/2008 Tuymer et al.
2008/0198634 A1 8/2008 Scheel et al.
2008/0231337 A1 9/2008 Krishnaswamy et al.
2008/0252225 A1 10/2008 Kurachi et al.
2008/0272706 A1 11/2008 Kwon et al.
2009/0016549 A1 1/2009 French et al.
2009/0108759 A1 4/2009 Tao et al.
2009/0255800 A1 10/2009 Koshimizu
2009/0322307 A1 12/2009 Ide
2010/0007358 A1 1/2010 Schaerrer et al.
2010/0141224 A1 6/2010 Ilic et al.
2010/0148847 A1 6/2010 Schurack et al.
2010/0284208 A1 11/2010 Nguyen et al.
2011/0001438 A1 1/2011 Chemel et al.
2011/0133651 A1 6/2011 Chistyakov et al.
2011/0140607 A1 6/2011 Moore et al.
2011/0190755 A1 8/2011 Mathur et al.
2011/0309748 A1 12/2011 Xia
2012/0016282 A1 1/2012 Van Brunt et al.
2012/0052599 A1 3/2012 Brouk et al.
2012/0081350 A1 4/2012 Sano et al.
2012/0155613 A1 6/2012 Caiafa et al.
2012/0228263 A1 9/2012 Ui et al.
2013/0024784 A1 1/2013 Lifton
2013/0027848 A1 1/2013 Said
2013/0029492 A1 1/2013 Inoue et al.
2013/0059448 A1 3/2013 Marakhtanov et al.
2013/0075390 A1 3/2013 Ashida
2013/0092529 A1 4/2013 Singh et al.
2013/0113650 A1 5/2013 Behbahani et al.
2013/0138097 A1 5/2013 Mathur et al.
2013/0146443 A1 6/2013 Papa et al.
2013/0174105 A1 7/2013 Nishio et al.
2013/0175573 A1 7/2013 Mayer et al.
2013/0175575 A1 7/2013 Ziemba et al.
2013/0213935 A1 8/2013 Liao et al.
2013/0320953 A1 12/2013 Cassel et al.
2014/0009969 A1 1/2014 Yuzurihara et al.
2014/0021180 A1 1/2014 Vogel
2014/0077611 A1 3/2014 Young et al.
2014/0109886 A1 4/2014 Singleton et al.
2014/0118414 A1 5/2014 Seo et al.
2014/0146571 A1 5/2014 Ryoo et al.
2014/0268968 A1 9/2014 Richardson
2014/0349418 A1 11/2014 Inoue et al.
2014/0354343 A1 12/2014 Ziemba et al.
2015/0028932 A1 1/2015 Ziemba et al.
2015/0076372 A1 3/2015 Ziemba et al.
2015/0084509 A1 3/2015 Yuzurihara et al.
2015/0130525 A1 5/2015 Miller et al.
2015/0155086 A1 6/2015 Matsuura
2015/0184284 A1 7/2015 Elghazzali et al.
2015/0206716 A1 7/2015 Kim et al.
2015/0256086 A1 9/2015 Miller et al.
2015/0303914 A1 10/2015 Ziemba et al.
2015/0311680 A1 10/2015 Burrows et al.
2015/0318846 A1 11/2015 Prager et al.
2016/0020070 A1 1/2016 Kim et al.
2016/0020072 A1 1/2016 Brouk et al.
2016/0020672 A1 1/2016 Shuck et al.
2016/0182001 A1 6/2016 Zeng et al.
2016/0211153 A1 7/2016 Terauchi et al.
2016/0220670 A1 8/2016 Kalghatgi et al.
2016/0225587 A1 8/2016 Inoue et al.
2016/0241234 A1 8/2016 Mavretic
2016/0269195 A1 9/2016 Coenen et al.
2016/0327029 A1 11/2016 Ziemba et al.
2016/0327089 A1 11/2016 Adam et al.
2016/0358755 A1 12/2016 Long et al.
2017/0083810 A1 3/2017 Ielmini et al.
2017/0104469 A1 4/2017 Mavretic
2017/0125517 A1 5/2017 Tapily et al.
2017/0126049 A1 5/2017 Pan et al.
2017/0154726 A1 6/2017 Prager et al.
2017/0243731 A1 8/2017 Ziemba et al.
2017/0294842 A1 10/2017 Miller et al.
2017/0311431 A1 10/2017 Park
2017/0314133 A1 11/2017 Kim et al.
2017/0330729 A1 11/2017 Mavretic
2017/0359886 A1 12/2017 Binderbauer et al.
2017/0366173 A1 12/2017 Miller et al.
2018/0041183 A1 2/2018 Mavretic et al.
2018/0226896 A1 8/2018 Miller et al.
2018/0286636 A1 10/2018 Ziemba et al.
2018/0315581 A1 11/2018 Hayami et al.
2018/0315583 A1 11/2018 Luere et al.
2018/0323576 A1 11/2018 Crawford et al.
2018/0374689 A1 12/2018 Abraham et al.
2019/0074806 A1 3/2019 Scott et al.
2019/0080884 A1 3/2019 Ziemba et al.
2019/0088518 A1 3/2019 Koh et al.
2019/0131110 A1 5/2019 Ziemba et al.
2019/0157044 A1 5/2019 Ziemba et al.
2019/0157980 A1 5/2019 Ji et al.
2019/0172683 A1 6/2019 Mavretic et al.
2019/0172685 A1 6/2019 Van Zyl et al.
2019/0180982 A1 6/2019 Brouk et al.
2019/0228952 A1 7/2019 Dorf et al.
2019/0236426 A1 8/2019 Zhang et al.
2019/0267212 A1 8/2019 Mavretic
2019/0295821 A1 9/2019 Shoeb et al.

(56) References Cited

U.S. PATENT DOCUMENTS

| | | | | |
|---|---|---|---|---|
| 2019/0326092 | A1 | 10/2019 | Ogasawara et al. | |
| 2019/0348258 | A1 | 11/2019 | Koh et al. | |
| 2019/0350072 | A1 | 11/2019 | Dorf et al. | |
| 2019/0393791 | A1* | 12/2019 | Ziemba | H03H 7/01 |
| 2020/0035457 | A1 | 1/2020 | Ziemba et al. | |
| 2020/0035458 | A1 | 1/2020 | Ziemba et al. | |
| 2020/0036367 | A1 | 1/2020 | Slobodov et al. | |
| 2020/0037468 | A1 | 1/2020 | Ziemba et al. | |
| 2020/0043702 | A1 | 2/2020 | Ziemba et al. | |
| 2020/0051786 | A1 | 2/2020 | Ziemba et al. | |
| 2020/0126760 | A1 | 4/2020 | Ziemba et al. | |
| 2020/0144030 | A1 | 5/2020 | Prager et al. | |
| 2020/0154556 | A1 | 5/2020 | Dorf et al. | |
| 2020/0161092 | A1 | 5/2020 | Inoue et al. | |
| 2020/0168436 | A1 | 5/2020 | Ziemba et al. | |
| 2020/0168437 | A1 | 5/2020 | Ziemba et al. | |
| 2020/0176221 | A1 | 6/2020 | Prager et al. | |
| 2020/0219702 | A1 | 7/2020 | Prager et al. | |
| 2020/0227230 | A1 | 7/2020 | Ziemba et al. | |
| 2020/0244254 | A1 | 7/2020 | Slobodov et al. | |
| 2020/0352017 | A1 | 11/2020 | Dorf et al. | |
| 2020/0378605 | A1 | 12/2020 | Lacoste | |
| 2020/0396820 | A1 | 12/2020 | de Vries et al. | |
| 2021/0013011 | A1 | 1/2021 | Prager et al. | |
| 2021/0091759 | A1 | 3/2021 | Prager et al. | |
| 2021/0152163 | A1 | 5/2021 | Miller et al. | |
| 2021/0288582 | A1 | 9/2021 | Ziemba et al. | |
| 2022/0013329 | A1 | 1/2022 | Bowman et al. | |
| 2024/0088877 | A1 | 3/2024 | Henson et al. | |
| 2024/0138908 | A1 | 5/2024 | Stewart et al. | |

FOREIGN PATENT DOCUMENTS

| | | | |
|---|---|---|---|
| CN | 103890897 | A | 6/2014 |
| CN | 103458600 | B | 7/2016 |
| CN | 106537776 | A | 3/2017 |
| CN | 210056212 | U | 2/2020 |
| CN | 112511136 | A | 3/2021 |
| CN | 113179029 | A | 7/2021 |
| CN | 113630107 | A | 11/2021 |
| CN | 114649972 | A | 6/2022 |
| CN | 115065342 | A | 9/2022 |
| CN | 115395926 | A | 11/2022 |
| EP | 0174164 | A2 | 3/1986 |
| EP | 0840350 | A2 | 5/1998 |
| EP | 0947048 | A1 | 10/1999 |
| EP | 1128557 | A2 | 8/2001 |
| EP | 1515430 | A1 | 3/2005 |
| EP | 3167549 | B1 | 3/2019 |
| FR | 2771563 | A1 | 5/1999 |
| JP | H09120956 | A | 5/1997 |
| JP | H09129621 | A | 5/1997 |
| JP | H10223952 | A | 8/1998 |
| JP | H11164552 | A | 6/1999 |
| JP | H11172436 | A | 6/1999 |
| JP | 2000268996 | A | 9/2000 |
| JP | 2000306891 | A | 11/2000 |
| JP | 2001181830 | A | 7/2001 |
| JP | 2002222801 | A | 8/2002 |
| JP | 2002324698 | A | 11/2002 |
| JP | 2002359979 | A | 12/2002 |
| JP | 2004101788 | A | 4/2004 |
| JP | 2004340036 | A | 12/2004 |
| JP | 2007203088 | A | 8/2007 |
| JP | 2009263778 | A | 11/2009 |
| JP | 2012065547 | A | 3/2012 |
| JP | 2013135159 | A | 7/2013 |
| JP | 5770628 | B2 | 8/2015 |
| JP | 2015531025 | A | 10/2015 |
| JP | 2015220929 | A | 12/2015 |
| JP | 5852380 | B2 | 2/2016 |
| JP | 2016134461 | A | 7/2016 |
| JP | 2016181343 | A | 10/2016 |
| JP | 2017501298 | A | 1/2017 |
| JP | 2017504955 | A | 2/2017 |
| JP | 6310601 | B1 | 4/2018 |
| JP | 2019197890 | A | 11/2019 |
| JP | 2020501351 | A | 1/2020 |
| JP | 2020529180 | A | 10/2020 |
| KR | 20200036947 | A | 4/2020 |
| TW | 200739723 | A | 10/2007 |
| TW | I380151 | B | 12/2012 |
| TW | I474601 | B | 2/2015 |
| TW | 201515525 | A | 4/2015 |
| TW | I564928 | B | 1/2017 |
| WO | 9738479 | A1 | 10/1997 |
| WO | 9960679 | A1 | 11/1999 |
| WO | 0193419 | A1 | 12/2001 |
| WO | 2010069317 | A1 | 6/2010 |
| WO | 2014036000 | A1 | 3/2014 |
| WO | 2016171582 | A1 | 10/2016 |
| WO | 2017126662 | A1 | 7/2017 |
| WO | 2018008310 | A1 | 1/2018 |
| WO | 2018034771 | A1 | 2/2018 |
| WO | 2018186901 | A1 | 10/2018 |
| WO | 2019040949 | A1 | 2/2019 |
| WO | 2020146436 | A1 | 7/2020 |
| WO | 2020160497 | A1 | 8/2020 |
| WO | 2021003319 | A1 | 1/2021 |

OTHER PUBLICATIONS

Notice of Reason for Refusal for JP Patent Application No. 2023-520043, mailed on Apr. 2, 2024, 8 pages.

Office Action in KR Patent application No. 2023-7028274 dated Apr. 19, 2024, 4 pages.

Office Action in KR Patent application No. 2023-7029360 dated Apr. 19, 2024, 10 pages.

Non-Final Office Action in U.S. Appl. No. 18/493,515 dated May 6, 2024, 8 pages.

Final Office Action in U.S. Appl. No. 15/623,464, dated Mar. 27, 2018, 18 pages.

International Search Report and Written Opinion as issued in connection with International Patent Application No. PCT/US2018/016993, mailed Apr. 18, 2018, 11 pages.

Non-Final Office Action in U.S. Appl. No. 15/889,586 dated Sep. 12, 2018, 18 pages.

Notice of Allowance in U.S. Appl. No. 14/798,154 dated Jun. 1, 2018, 05 pages.

International Search Report and Written Opinion as issued in connection with International Patent Application No. PCT/US2018/025440, mailed Jun. 25, 2018, 24 pages.

Notice of Allowance in U.S. Appl. No. 15/623,464, dated Oct. 17, 2018, 7 pages.

International Search Report and Written Opinion as issued in connection with International Patent Application No. PCT/US2018/048206, mailed Nov. 1, 2018, 10 pages.

Non Final Office Action in U.S. Appl. No. 15/941,731, dated Nov. 16, 2018, 17 pages.

Non-Final Office Action in U.S. Appl. No. 15/921,650 dated Nov. 28, 2018, 11 pages.

Non Final Office Action in U.S. Appl. No. 16/178,538, dated Jan. 11, 2019, 27 pages.

Non Final Office Action in U.S. Appl. No. 16/250,765, dated Mar. 29, 2019, 11 pages.

Notice of Allowance in U.S. Appl. No. 16/114,195, dated Apr. 3, 2019, 9 pages.

Notice of Allowance in U.S. Appl. No. 15/921,650 dated Apr. 4, 2019, 7 pages.

Non Final Office Action in U.S. Appl. No. 16/178,565, dated Apr. 4, 2019, 10 pages.

Final Office Action in U.S. Appl. No. 15/889,586 dated May 2, 2019, 19 pages.

Final Office Action in U.S. Appl. No. 15/941,731, dated May 3, 2019, 16 pages.

Final Office Action in U.S. Appl. No. 16/178,538 dated Jun. 7, 2019, 17 pages.

Notice of Allowance in U.S. Appl. No. 16/250,765, dated Jul. 10, 2019, 9 pages.

(56) References Cited

OTHER PUBLICATIONS

Final Office Action in U.S. Appl. No. 16/178,565, dated Jul. 12, 2019, 11 pages.
Notice of Allowance in U.S. Appl. No. 16/178,538 dated Jul. 17, 2019, 10 pages.
Notice of Allowance in U.S. Appl. No. 15/941,731, dated Jul. 17, 2019, 12 pages.
Non-Final Office Action in U.S. Appl. No. 15/889,586 dated Sep. 6, 2019, 17 pages.
Invitation to pay additional fees as issued in connection with International Patent Application No. PCT/US2019/043932, mailed Sep. 30, 2019, 2 pages.
International Preliminary Report on Patentability in connection with International Patent Application No. PCT/US2018/025440, mailed Oct. 1, 2019, 10 pages.
Invitation to pay additional fees as issued in connection with International Patent Application No. PCT/US2019/043988, mailed Oct. 10, 2019, 2 pages.
International Search Report and Written Opinion as issued in connection with International Patent Application No. PCT/US2019/043933, mailed Oct. 25, 2019, 9 pages.
Invitation to pay additional fees as issued in connection with International Patent Application No. PCT/US2019/046067, mailed Oct. 29, 2019, 2 pages.
Notice of Allowance in U.S. Appl. No. 16/178,565, dated Nov. 14, 2019, 5 pages.
Non Final Office Action in U.S. Appl. No. 15/945,722, dated Nov. 15, 2019, 13 pages.
International Search Report and Written Opinion as issued in connection with International Patent Application No. PCT/US2019/043932, mailed Dec. 5, 2019, 16 pages.
International Search Report and Written Opinion as issued in connection with International Patent Application No. PCT/US2019/043988, mailed Dec. 10, 2019, 13 pages.
Non Final Office Action in U.S. Appl. No. 16/250,157 dated Dec. 19, 2019, 6 pages.
International Search Report and Written Opinion as issued in connection with International Patent Application No. PCT/US2019/046067, mailed Jan. 3, 2020, 13 pages.
Notice of Allowance in U.S. Appl. No. 16/525,357, dated Jan. 14, 2020, 8 pages.
Non-Final Office Action in U.S. Appl. No. 16/599,318, dated Jan. 16, 2020, 11 pages.
Non-Final Office Action in U.S. Appl. No. 16/722,085, dated Mar. 6, 2020, 5 pages.
Final Office Action in U.S. Appl. No. 15/889,586 dated Mar. 18, 2020, 18 pages.
Non-Final Office Action in U.S. Appl. No. 16/523,840, dated Mar. 19, 2020, 6 pages.
Restriction Requirement in U.S. Appl. No. 16/537,513, dated Apr. 1, 2020, 7 pages.
Notice of Allowance in U.S. Appl. No. 15/945,722, dated Apr. 3, 2020, 7 pages.
Non-Final Office Action in U.S. Appl. No. 16/736,971, dated Apr. 7, 2020, 14 pages.
International Search Report and Written Opinion as issued in connection with International Patent Application No. PCT/US2019/013988, mailed Apr. 9, 2020, 8 pages.
Notice of Allowance in U.S. Appl. No. 16/250,157 dated Apr. 13, 2020, 8 pages.
Non-Final Office Action in U.S. Appl. No. 16/457,791 dated Apr. 15, 2020, 12 pages.
Non-Final Office Action in U.S. Appl. No. 16/524,950, dated Apr. 16, 2020, 8 pages.
Final Office Action in U.S. Appl. No. 16/736,971, dated Apr. 17, 2020, 6 pages.
International Search Report and Written Opinion as issued in connection with International Patent Application No. PCT/US2020/016253, mailed Apr. 29, 2020, 7 pages.
Restriction Requirement in U.S. Appl. No. 16/524,967, dated Apr. 29, 2020, 6 pages.
Advisory Action in U.S. Appl. No. 16/736,971, dated May 12, 2020, 5 pages.
Non-Final Office Action in U.S. Appl. No. 16/722,115, dated May 14, 2020, 6 pages.
Non-Final Office Action in U.S. Appl. No. 16/555,948, dated May 15, 2020, 8 pages.
International Search Report and Written Opinion as issued in connection with International Patent Application No. PCT/US2020/012641, mailed May 28, 2020, 15 pages.
Extended European Search Report for Application No. 18848041.2, 9 pages.
Non Final Office Action in U.S. Appl. No. 16/697,173, dated Jun. 26, 2020, 19 pages.
Final Office Action in U.S. Appl. No. 16/523,840, dated Jun. 26, 2020, 5 pages.
Notice of Allowance in U.S. Appl. No. 16/736,971, dated Jun. 30, 2020, 14 pages.
Advisory Action in U.S. Appl. No. 15/889,586 dated Jul. 10, 2020, 4 pages.
Notice of Allowance in U.S. Appl. No. 16/722,085, dated Jul. 16, 2020, 8 pages.
Non Final Office Action in U.S. Appl. No. 16/779,270, dated Jul. 16, 2020, 9 pages.
Notice of Allowance in U.S. Appl. No. 16/524,967, dated Jul. 17, 2020, 11 pages.
Final Office Action in U.S. Appl. No. 16/599,318, dated Jul. 23, 2020, 14 pages.
Notice of Allowance in U.S. Appl. No. 16/599,318, dated Aug. 4, 2020, 8 pages.
Notice of Allowance in U.S. Appl. No. 16/779,270, dated Aug. 10, 2020, 6 pages.
Non Final Office Action in U.S. Appl. No. 16/537,513, dated Sep. 3, 2020, 13 pages.
Non-Final Office Action in U.S. Appl. No. 15/889,586 dated Sep. 18, 2020, 19 pages.
International Search Report and Written Opinion as issued in connection with International Patent Application No. PCT/US2020/040579, mailed Sep. 30, 2020, 10 pages.
Notice of Allowance in U.S. Appl. No. 16/523,840, dated Sep. 30, 2020, 11 pages.
Notice of Allowance in U.S. Appl. No. 16/779,270, dated Oct. 8, 2020, 5 pages.
International Search Report and Written Opinion as issued in connection with International Patent Application No. PCT/US2020/034427, mailed Oct. 16, 2020, 9 pages.
Notice of Allowance in U.S. Appl. No. 16/524,950, dated Oct. 19, 2020, 9 pages.
Notice of Allowance in U.S. Appl. No. 16/524,950, dated Nov. 16, 2020, 9 pages.
Non Final Office Action in U.S. Appl. No. 16/903,374, dated Nov. 25, 2020, 16 pages.
Final Office Action in U.S. Appl. No. 16/722,115, dated Dec. 2, 2020, 7 pages.
Notice of Allowance in U.S. Appl. No. 16/523,840, dated Dec. 4, 2020, 11 pages.
Final Office Action in U.S. Appl. No. 16/537,513, dated Jan. 7, 2021, 12 pages.
Notice of Allowance in U.S. Appl. No. 16/555,948, dated Jan. 13, 2021, 7 pages.
Notice of Allowance in U.S. Appl. No. 16/524,926, dated Jan. 15, 2021, 9 pages.
Notice of Allowance in U.S. Appl. No. 16/457,791 dated Jan. 22, 2021, 7 pages.
International Search Report and written opinion received for PCT Patent Application No. PCT/US2020/60799, mailed in Feb. 5, 2021, 11 pages.
Notice of Allowance in U.S. Appl. No. 16/697,173, dated Feb. 9, 2021, 13 pages.
International Preliminary Report On Patentability in PCT Application No. PCT/US2019/046067, dated Feb. 16, 2021, 09 Pages.

(56) References Cited

OTHER PUBLICATIONS

Notice of Allowance in U.S. Appl. No. 16/848,830, dated Feb. 19, 2021, 8 pages.
Extended European Search Report for Application No. 20195265.2, 8 pages.
Notice of Allowance in U.S. Appl. No. 16/722,115, dated Apr. 1, 2021, 9 pages.
Notice of Allowance in U.S. Appl. No. 15/889,586 dated Apr. 14, 2021, 9 pages.
Non Final Office Action in U.S. Appl. No. 16/941,532, dated Apr. 14, 2021, 10 pages.
Advisory Action in U.S. Appl. No. 16/537,513, dated Apr. 22, 2021, 5 pages.
Notice of Allowance in U.S. Appl. No. 16/721,396, dated Apr. 23, 2021, 10 pages.
Extended European Search Report for Application No. 20200919.7, 11 pages.
Non-Final Office Action in U.S. Appl. No. 16/722,115, dated May 3, 2021, 9 pages.
International Search Report and Written Opinion as issued in connection with International Patent Application No. PCT/US2020/066990, mailed May 5, 2021, 9 pages.
Notice of Allowance in U.S. Appl. No. 16/848,830, dated May 13, 2021, 6 pages.
Non-Final Office Action in U.S. Appl. No. 15/889,586 dated Jun. 11, 2021, 11 pages.
International Preliminary Report on Patentability in connection with International Patent Application No. PCT/US2020/012641, mailed Jun. 16, 2021, 11 pages.
Non-Final Office Action in U.S. Appl. No. 16/941,532 dated Jul. 16, 2021, 10 pages.
Notice of Allowance in U.S. Appl. No. 16/903,374, dated Jul. 19, 2021, 8 pages.
Notice of Reason for Refusal for JP Patent Application No. 2021-504454, mailed on Jul. 20, 2021, 8 pages.
Notice of Reason for Refusal for JP Patent Application No. 2021-504453, mailed on Jul. 20, 2021, 16 pages.
International Preliminary Report On Patentability dated Jul. 27, 2021 in PCT Application No. PCT/US2020/016253, 06 pages.
Non-Final Office Action in U.S. Appl. No. 16/937,948, dated Aug. 24, 2021, 10 pages.
Extended European Search Report for Application No. 21876672.3, 9 pages.
Notice of Allowance in U.S. Appl. No. 18/493,515 mailed on Nov. 4, 2024, 9 pages.
Restriction Requirement in U.S. Appl. No. 18/642,777, dated Nov. 8, 2024, 7 pages.
Non-Final Office Action in U.S. Appl. No. 18/512,002 dated Dec. 23, 2024, 9 pages.
Kim, Y., et al., "The Design of Inverter Power System for Plasma Generator", 2005 International Conference on Electrical Machines and Systems, vol. 2, pp. 1309-1312 (2005).
First Office Action in CN Patent application No. 201980051988.5 dated Aug. 6, 2024, 22 pages.
Notice of Reason for Refusal for JP Patent Application No. 2023-176000, mailed on Sep. 17, 2024, 4 pages.
Office Action in KR Patent application No. 2023-7031086 dated Oct. 10, 2024, 22 pages.
International Search Report and Written Opinion, as issued in connection with International Patent Application No. PCT/US2024/015658, mailed Aug. 5, 2024, 11 pages.
Bland, M.J., et al., "A High Power RF Power Supply for High Energy Physics Applications," Proceedings of 2005 the Particle Accelerator Conference, IEEE pp. 4018-4020 (May 16-20, 2005).
Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).
Garwin, R., "Pulsed Power Peer Review Committee Report," Sandia National Laboratories Report, SAND2000-2515, pp. 3-38 (Oct. 2000).
Gaudet, J.A., et al., "Research issues in Developing Compact Pulsed Power for High Peak Power Applications on Mobile Platforms," Proceedings of the IEEE, vol. 92, No. 7, pp. 1144-1165 (Jul. 2004).
Goodman, E. A., "Characteristics of sheet windings in transformers", IEEE Engineering, vol. 82, No. 11, pp. 673-676 (Nov. 1963) (Abstract).
In, Y., et al., "On the roles of direct feedback and error field correction in stabilizing resistive-wall modes," Nuclear 2 Fusion, vol. 50, No. 4, pp. 1-5 (2010).
Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).
Locher, R., "Introduction to Power MOSFETs and their Applications (Application Note 558)," Fairchild Semiconductor, 15 pages (Oct. 1998).
Locher, R.E., and Pathak, A.D., "Use of BiMOSFETs in Modern Radar Transmitters," IEEE International Conference on Power Electronics and Drive Systems, pp. 776-782 (2001).
Pokryvailo, A., et al., "A 1KW Pulsed Corona System for Pollution Control Applications," 14th IEEE International Pulsed Power Conference, Dallas, TX, USA (Jun. 15-18, 2003).
Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).
Prager, J.R. et al., "A High Voltage Nanosecond Pulser with Variable Pulse Width and Pulse Repetition Frequency control For Nonequilibrium Plasma Applications", 41st International Conference on Plasma Sciences held with 2014 IEEE International Conference on High-Power Particle Beams, May 25-29, 2014, 6, Washington, D.C.
Pustylnik, M., et al., "High-voltage nanosecond pulses in a low-pressure radiofrequency discharge", Physical Review E, vol. 87, No. 6, pp. 1-9 (2013).
Quinley, M., et al., "High Voltage Nanosecond Pulser Operating at 30 KW and 400 kHz" APS-GEC-2018, 1 page (2018).
Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).
Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).
Schamiloglu, E., et al., "Scanning the Technology: Modem Pulsed Power: Charlie Martin and Beyond," Proceedings of the IEEE, vol. 92, No. 7 , pp. 1014-1020 (Jul. 2004).
Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).
Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).
Starikovskiy, A., and Aleksandrov, N., "Plasma-assisted ignition and combustion," Progress in Energy and Combustion Science, vol. 39, No. 1, pp. 61-110 (Feb. 2013).
Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).

(56) References Cited

OTHER PUBLICATIONS

Zhu, Z., et al., "High Voltage pulser with a fast fall-time for plasma immersion ion implantation," Review of Scientific Instruments, vol. 82, No. 4, pp. 045102-1-045102-4 (Apr. 2011).
International Search Report and Written Opinion as issued in connection with International Patent Application No. PCT/US2014/040929, mailed Sep. 15, 2014, 10 pages.
International Search Report and Written Opinion as issued in connection with International Patent Application No. PCT/US2014/065832, mailed Feb. 20, 2015, 13 pages.
Invitation to pay additional fees in PCT Application No. PCT/US2015/018349 mailed on May 15, 2015, 2 pages.
International Search Report and Written Opinion as issued in connection with International Patent Application No. PCT/US2015/018349, mailed Jul. 14, 2015, 15 pages.
International Search Report and Written Opinion as issued in connection with International Patent Application No. PCT/US2015/040204, mailed Oct. 6, 2015, 12 pages.
Non-Final Office Action in U.S. Appl. No. 14/542,487 dated Nov. 23, 2015, 11 pages.
Non-Final Office Action in U.S. Appl. No. 14/798,154 dated Jan. 5, 2016, 13 pages.
Final Office Action in U.S. Appl. No. 14/542,487 dated Feb. 12, 2016, 11 pages.
Non-Final Office Action in U.S. Appl. No. 14/542,487 dated Apr. 8, 2016, 12 pages.
International Preliminary Report on Patentability in PCT Application No. PCT/US2014/065832 mailed on May 17, 2016, 7 pages.
Non Final Office Action in U.S. Appl. No. 14/635,991, dated Jul. 29, 2016, 17 pages.
International Preliminary Report on Patentability in PCT Application No. PCT/US2015/018349 mailed on Sep. 6, 2016, 8 pages.
Final Office Action in U.S. Appl. No. 14/798,154 dated Oct. 6, 2016, 14 pages.
Final Office Action in U.S. Appl. No. 14/542,487 dated Dec. 12, 2016, 13 pages.
International Preliminary Report on Patentability in PCT Application No. PCT/US2015/040204 mailed on Jan. 17, 2017, 7 pages.
Final Office Action in U.S. Appl. No. 14/635,991, dated Jan. 23, 2017, 22 pages.
Advisory Action in U.S. Appl. No. 14/542,487 dated Mar. 28, 2017, 03 pages.
Notice of Allowance in U.S. Appl. No. 14/635,991, dated May 4, 2017, 07 pages.
Non-Final Office Action in U.S. Appl. No. 14/798,154 dated May 26, 2017, 16 pages.
Non-Final Office Action in U.S. Appl. No. 14/542,487 dated Jun. 5, 2017, 12 pages.
Partial Supplementary European Search Report in related foreign application No. 14861818.4, 12 Pages.
Non Final Office Action in U.S. Appl. No. 15/623,464, dated Nov. 7, 2017, 18 pages.
Final Office Action in U.S. Appl. No. 14/542,487 dated Dec. 19, 2017, 07 pages.
Final Office Action in U.S. Appl. No. 14/798,154 dated Dec. 28, 2017, 06 pages.
Notice of Allowance in U.S. Appl. No. 14/542,487 dated Mar. 21, 2018, 05 pages.
Restriction Requirement in U.S. Appl. No. 17/133,612, dated Aug. 26, 2021, 5 pages.
Non-Final Office Action in U.S. Appl. No. 17/223,004, dated Aug. 31, 2021, 12 pages.
Invitation to Pay Additional Fees as issued in connection with International Patent Application No. PCT/US2021/41180, mailed Sep. 21, 2021, 2 pages.
Non-Final Office Action in U.S. Appl. No. 17/033,662 dated Sep. 1, 2021, 17 pages.
Notice of Allowance in U.S. Appl. No. 16/722,115 dated Oct. 4, 2021, 9 pages.
Notice of Allowance in U.S. Appl. No. 16/537,513, dated Oct. 8, 2021, 10 pages.
Notice of Allowance in U.S. Appl. No. 16/737,615 dated Nov. 24, 2021, 11 pages.
International Search Report and Written Opinion as issued in connection with International Patent Application No. PCT/US2021/41180, mailed Dec. 7, 2021, 11 pages.
Final Office Action in U.S. Appl. No. 17/033,662 dated Dec. 8, 2021, 17 pages.
Non-Final Office Action in U.S. Appl. No. 17/213,230 dated Dec. 14, 2021, 6 pages.
English translation of Office Action for Taiwan application No. 109100609 mailed Dec. 16, 2021, 5 pages.
Invitation to Pay Additional Fees in PCT Application No. PCT/US2021/053436 mailed on Dec. 2, 2021, 2 pages.
Restriction Requirement in U.S. Appl. No. 17/099,729 dated on Jan. 20, 2022, 7 pages.
Notification of Reason for Refusal in JP Patent application No. 2021-101259 dated Feb. 1, 2022, 21 pages.
International Search Report and Written Opinion in PCT Application No. PCT/US2021/053436 mailed on Feb. 8, 2022, 13 pages.
Notice of Reason for Refusal for JP Patent Application No. 2021-504453, mailed on Mar. 1, 2022, 12 pages.
Non-Final Office Action in U.S. Appl. No. 17/163,331 dated Mar. 4, 2022, 23 pages.
Non Final Office Action in U.S. Appl. No. 17/142,069 dated Mar. 7, 2022, 7 pages.
Notice of Allowance in U.S. Appl. No. 16/941,532, dated Apr. 5, 2022, 9 pages.
Notice of Allowance in U.S. Appl. No. 17/099,729 dated Apr. 21, 2022 10 pages.
Notice of Allowance in U.S. Appl. No. 17/372,398 dated Apr. 27, 2022, 9 pages.
Final Office Action in U.S. Appl. No. 17/223,004 dated May 11, 2022, 9 pages.
Final Office Action in U.S. Appl. No. 17/213,230 dated May 16, 2022, 16 pages.
International Preliminary Report in Patentability PCT Application No. PCT/US2020/60799, dated May 17, 2022, 09 pages.
Non Final Office Action in U.S. Appl. No. 17/231,923, dated Jun. 6, 2022, 6 pages.
Non-Final Office Action in U.S. Appl. No. 17/499,863 dated Jun. 7, 2022, 15 pages.
Non-Final Office Action in U.S. Appl. No. 17/359,498, dated Jun. 29, 2022, 7 pages.
Decision of Refusal for JP Patent Application No. 2021-504453, mailed on Jul. 21, 2022, 11 pages.
Notice of Allowance in U.S. Appl. No. 17/223,004 dated Jul. 25, 2022, 8 pages.
Advisory Action in U.S. Appl. No. 17/213,230 dated Aug. 5, 2022, 3 pages.
Final Office Action in U.S. Appl. No. 17/142,069 dated Aug. 18, 2022, 06 pages.
Non-Final Office Action in U.S. Appl. No. 17/213,230 dated Sep. 15, 2022, 9 pages.
Notice of Allowance in U.S. Appl. No. 17/359,498, dated Oct. 12, 2022, 09 pages.
Notice of Allowance in U.S. Appl. No. 17/499,863 dated Oct. 19, 2022, 7 pages.
Notice of Allowance in U.S. Appl. No. 17/231,923, dated Nov. 16, 2022, 9 pages.
Non Final Office Action in U.S. Appl. No. 17/851,022 dated on Nov. 25, 2022, 8 pages.
Notice of Allowance in U.S. Appl. No. 17/098,207 dated Jan. 5, 2023, 15 pages.
Notice of Allowance in U.S. Appl. No. 17/033,662, dated Feb. 7, 2023, 9 pages.
Notice of Allowance in U.S. Appl. No. 17/834,933 mailed on Feb. 16, 2023, 9 pages.
Non-Final Office Action in U.S. Appl. No. 17/411,028 dated Feb. 24, 2023, 6 pages.
Notice of Allowance in U.S. Appl. No. 17/213,230 dated Mar. 8, 2023, 7 pages.

(56) References Cited

OTHER PUBLICATIONS

Notice of Allowance in U.S. Appl. No. 17/851,022 dated Mar. 20, 2023, 10 pages.
Non Final Office Action in U.S. Appl. No. 17/853,891 dated on May 2, 2023, 9 pages.
Final Office Action in U.S. Appl. No. 17/411,028 dated Jun. 22, 2023, 9 pages.
Notice of Reason for Refusal for JP Patent Application No. 2022-034989, mailed on Jul. 11, 2023, 6 pages.
Notice of Allowance in U.S. Appl. No. 17/853,891 dated Aug. 15, 2023, 7 pages.
Notice of Allowance in U.S. Appl. No. 17/411,028 dated Aug. 30, 2023, 9 pages.
International Preliminary Report in Patentability PCT Application No. PCT/US2021/41180, dated Jan. 10, 2023, 08 pages.
Notice of Allowance in U.S. Appl. No. 17/142,069 dated Jan. 11, 2023, 10 pages.
Non-Final Office Action in U.S. Appl. No. 18/340,841 dated Jan. 24, 2023, 18 pages.
Office Action in KR Patent application No. 2023-7015060 dated Jul. 25, 2024, 14 pages.
Extended European Search Report for Application No. 23158873.2, 9 pages.
Restriction Requirement in U.S. Appl. No. 17/493,835 dated Jul. 6, 2023, 7 pages.
International Search Report and Written Opinion as issued in connection with International Patent Application No. PCT/US2023/069316, mailed Sep. 5, 2023, 08 pages.
Extended European Search Report for Application No. 20887869.4, 8 pages.
Non Final Office Action in U.S. Appl. No. 17/493,835 dated on Sep. 21, 2023, 9 pages.
Notice of Reason for Refusal for JP Patent Application No. 2021-504453, mailed on Jan. 9, 2024, 5 pages.
Notice of Allowance in U.S. Appl. No. 17/493,835 dated Jan. 18, 2024, 9 pages.

* cited by examiner

PULSING POWER SUPPLY WITH POWERED CROWBAR

BACKGROUND

High voltage pulsing power supplies with fast pulse repetition frequencies have many applications in semiconductors processing, medical devices, fusion, green energy, chemical processing, plasma devices, etc. The combination of high voltages and fast pulse repetition frequencies can be difficult. For example, capacitors can be charged to high voltages and the time it takes to discharge these capacitors can limit the pulse repetition frequency. As another example, transformers can also take some time to deflux. This deflux time, can limit the pulse repetition frequency.

SUMMARY

In some aspects, the techniques described in this document relate to a pulsing power supply system including: a pulser having an output that outputs pulses greater than 5 kV with a pulse repetition frequency greater than 10 kHz; a powered crowbar circuit electrically coupled across the output, the powered crowbar circuit includes a DC source and a diode arranged in series, a polarity of the DC source is arranged opposite a polarity of the pulser; a transformer having a primary side and a secondary side, the primary side of the transformer is electrically coupled across the output of the pulser and across the powered crowbar circuit; and a one or more electrodes electrically coupled with the secondary-side of the transformer.

In some aspects, the techniques described in this document relate to a pulsing power supply system, further including one or more diodes electrically coupled with respective ones of the one or more electrodes.

In some aspects, the techniques described in this document relate to a pulsing power supply system, further including: a second pulser having a second output that outputs pulses greater than 5 kV with a pulse repetition frequency greater than 10 kHz; a second powered crowbar circuit electrically coupled across the second output, the second powered crowbar circuit including a DC source; a second transformer having a primary side and a secondary side, the primary side of the second transformer is electrically coupled across the output of the second pulser and across the second powered crowbar circuit; and a second one or more electrodes electrically coupled with the secondary-side of the second transformer.

In some aspects, the techniques described in this document relate to a pulsing power supply, wherein the inductance of the powered crowbar circuit is less than about 100 nH.

In some aspects, the techniques described in this document relate to a pulsing power supply, wherein the pulser outputs pulses with a voltage V1, a pulse width of T1, and a pulse turn off time of T2, and the voltage of the DC source outputs a voltage V2, wherein.

In some aspects, the techniques described in this document relate to a pulsing power supply, wherein the DC source includes an energy storage capacitor and a DC power supply.

In some aspects, the techniques described in this document relate to a pulsing power supply, further including an energy recovery circuit electrically coupled with the powered crowbar circuit and a DC power source of the pulser.

In some aspects, the techniques described in this document relate to a pulsing power supply including: a pulser having an output that outputs pulses greater than 5 kV with a pulse repetition frequency greater than 10 kHz; a transformer having a primary side and a secondary side, the secondary-side having a first end and a second end; and a powered crowbar circuit electrically coupled across the output of the pulser and across the primary side of the transformer, the powered crowbar circuit including: a DC source; and a crowbar diode having an anode.

In some aspects, the techniques described in this document relate to a pulsing power supply, wherein a polarity of the DC source is arranged opposite a polarity of the pulser.

In some aspects, the techniques described in this document relate to a pulsing power supply, wherein the inductance of the powered crowbar circuit is less than about 100 nH.

In some aspects, the techniques described in this document relate to a pulsing power supply, wherein the pulser outputs pulses with a voltage V1, a pulse width of T1, and a pulse turn off time of T2, and the voltage of the DC source outputs a voltage V2, wherein.

In some aspects, the techniques described in this document relate to a pulsing power supply, wherein the DC source includes an energy storage capacitor and a DC power supply.

In some aspects, the techniques described in this document relate to a pulsing power supply, further including a first secondary-side diode electrically coupled with the first end of the secondary-side of the transformer.

In some aspects, the techniques described in this document relate to a pulsing power supply, further including an electrode electrically coupled with the first secondary-side diode.

In some aspects, the techniques described in this document relate to a pulsing power supply, further including a secondary-side diode electrically coupled with the second end of the secondary-side of the transformer, the secondary-side diode has a polarity opposite a polarity of the first secondary-side diode.

In some aspects, the techniques described in this document relate to a pulsing power supply, further including a second electrode electrically coupled with the secondary-side diode.

In some aspects, the techniques described in this document relate to a pulsing power supply, further including an energy recovery circuit electrically coupled with the powered crowbar circuit and a DC power source of the pulser.

In some aspects, the techniques described in this document relate to a pulsing power supply including: a pulser having an output with a voltage V1 that outputs pulses with a voltage greater than 5 kV, a pulse width of T1, and a pulse turn off time of T2; a powered crowbar circuit electrically coupled across the output, the powered crowbar circuit including a DC source having a voltage V2; and a transformer having a primary side and a secondary side, the primary side of the transformer is electrically coupled across the output of the pulser and across the powered crowbar circuit; wherein In some aspects, the techniques described in this document relate to a pulsing power supply, wherein the inductance of the powered crowbar circuit is less than about 100 nH.

In some aspects, the techniques described in this document relate to a pulsing power supply, wherein the powered crowbar circuit includes: a capacitor arranged across the DC source; and a crowbar diode having an anode electrically coupled with the pulser.

In some aspects, the techniques described in this document relate to a pulsing power supply, further including: a first plurality of electrodes electrically coupled with the secondary-side of the first transformer; and a second plurality of electrodes electrically coupled with the secondary-side of the second transformer.

In some aspects, the techniques described in this document relate to a pulsing power supply, wherein a polarity of the DC source is arranged opposite a polarity of the pulser.

In some aspects, the techniques described in this document relate to a pulsing power supply, wherein the DC source includes an energy storage capacitor and a DC power supply.

In some aspects, the techniques described in this document relate to a pulsing power supply, further including an energy recovery circuit electrically coupled with the powered crowbar circuit and a DC power source of the pulser.

DETAILED DESCRIPTION

Examples of a pulsing power supply with a transformer are disclosed that can provide both positive and negative pulses to a load (or one or more electrodes) at high voltage and high frequencies.

Figure 1:
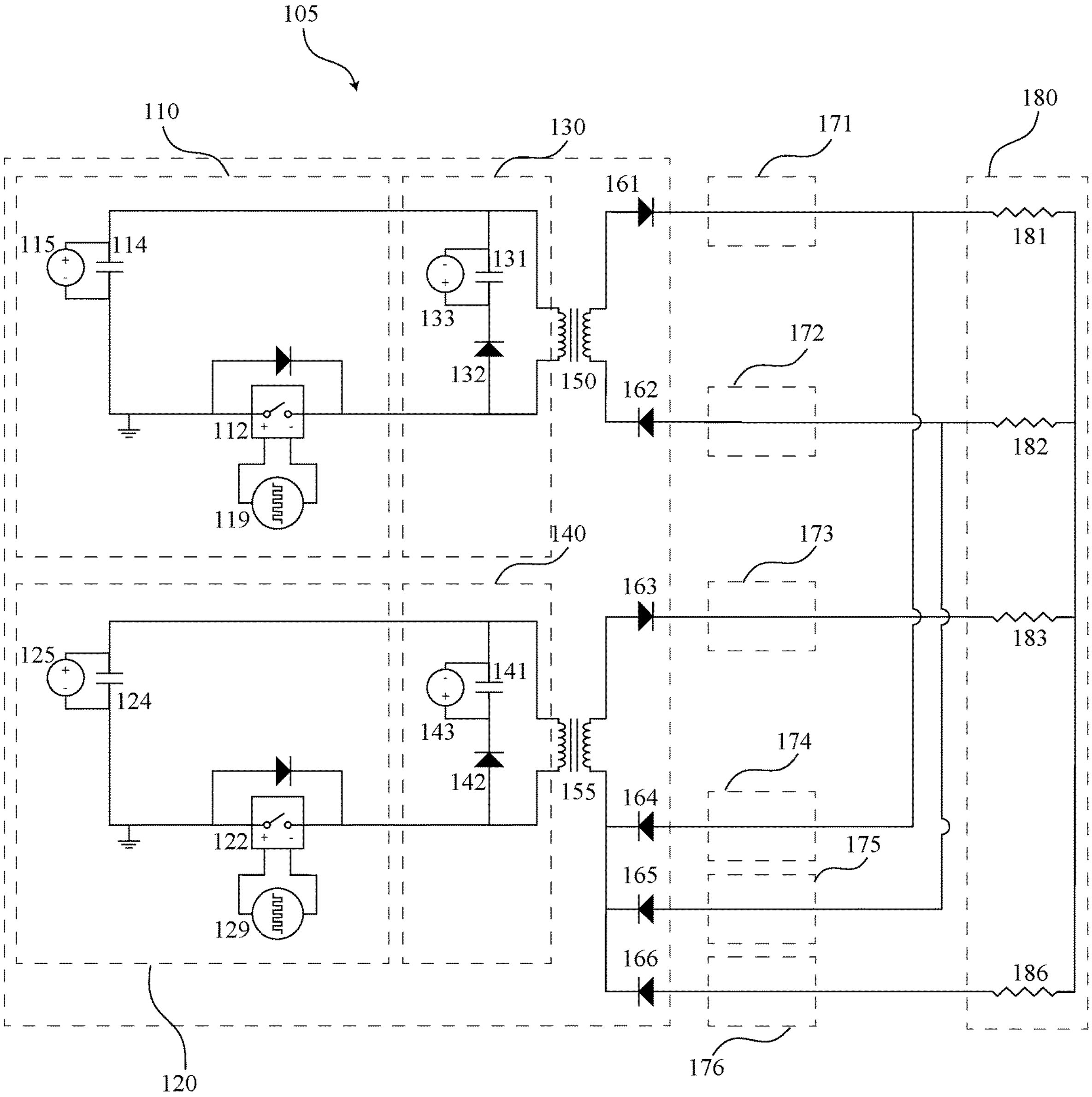
FIG. 1 is an example circuit diagram of a pulsing power supply system.

FIG. 1 is an example circuit diagram of a pulsing power supply system 105 coupled with one or more electrodes (e.g., electrode 171, 172, 173, 174, or load 910). The electrodes may be used in any number of ways such as, for example, inserted into, placed on, disposed on, coupled with, attached to a sample 180. The sample 180 may include an organ, a solution, blood, a body, skin, muscle, tissue, chamber, a brain, a breast, etc. The sample 180 may have an inherent resistance represented by resistors 181, 182, 183, 184.

The sample 180 may also include plasma in a plasma chamber, a reactor chamber in a chemical processing system, or any other system that includes one or more electrodes.

In some applications, the electrodes may be used for electroporation or ablation. In some applications, the electrodes may be part of a catheter, patch, etc. In some applications, the electrodes may be part of a plasma chamber, a reaction chamber, etc.

The pulsing power supply system 105, in this example, includes a first pulser 110 electrically coupled with a first powered crowbar circuit 130 and a transformer 150. In this example, the pulsing power supply system 105 includes a second pulser 120 electrically coupled with a second powered crowbar circuit 140 and a second transformer 155. The second pulser 120 is not required.

A pulser (e.g., the first pulser 110 and/or the second pulser 120), for example, can produce a plurality of high voltage pulses with a high pulse repetition frequency, fast rise times, and/or fast fall times. A pulser (e.g., all of the circuits shown in the drawings, the first pulser 110, and/or the second pulser 120), for example, may comprise a nanosecond pulser. A pulser may include all or part of a pulser disclosed in U.S. Pat. No. 9,960,763 titled "High Voltage Nanosecond pulser", U.S. Pat. No. 10,734,906, titled "Nanosecond Pulser", or U.S. Pat. No. 10,020,800 titled "High Voltage nanosecond Pulser with Variable Pulse Width and Pulse Repetition Frequency."

High voltage pulses, for example, may include pulses with any or all the following specifications: a frequency range of 1 kHz to 10 MHz, a pulse width range of 10 ns to 10 s, a rise time (and/or a fall time) of 1 ns to 100 μs, a duty cycle between 0 and 100%, a flat top ripple range between 0 and 200%, and/or an output voltage of more than 1 kV, 2 kV, 5 kV, 10 kV, 30 kV, 100 kV, 300 kV, 1,000 kV. High voltage pulses, for example, may include pulses with a rise time of less than 10 μs (or a rise time less than 1 μs), an output voltage greater than 1 kV, and/or a ripple between 2% and 50%.

A high voltage pulse may include non-sinusoidal pulses. A high voltage pulse may not have a sinusoidal shape. A high voltage pulse may include a fast rising voltage spike followed by a fast fall. A high voltage pulse may include a positive going pulse portion and a secondary pulse portion.

The first pulser 110, for example, can include a first switch module 112 with one or more solid state switches (e.g., IGBTs, a MOSFETs, a SiC MOSFETs, SiC junction transistors, FETs, SiC switches, GaN switches, photoconductive switches, etc.). One or more solid state switches and or circuits can be arranged in parallel or series. The first switch module 112, for example, may be coupled with a DC source that may include, for example, an energy storage capacitor 114 coupled with a DC power supply 115. The first switch module 112, for example, may be opened or closed based on timing signals from control source 119.

The second pulser 120, for example, can include a second switch module 122 with one or more solid state switches (e.g., IGBTs, a MOSFETs, a SiC MOSFETs, SiC junction transistors, FETs, SiC switches, GaN switches, photoconductive switches, etc.). One or more solid state switches and or circuits can be arranged in parallel or series. The second switch module 122 may be coupled with a DC source such as, for example, an energy storage capacitor 124 coupled with a DC power supply 125. The switch module 122, for example, may be opened or closed based on timing signals from control source 129, which may or may not be different from the timing provided to second switch module 122 provided by control source 129.

The first powered crowbar circuit 130, for example, may be disposed across the output of the first pulser 110. The first powered crowbar circuit 130, for example, may be disposed across the primary windings of the transformer 150. The first powered crowbar circuit 130, for example, may include a DC power supply 133, a crowbar diode 132 and an energy storage capacitor 131. The anode of the crowbar diode 132 may be electrically coupled with the collector of the first switch module 112 and the cathode of the crowbar diode 132 may be electrically coupled with the energy storage capacitor 131. The energy storage capacitor 131, for example, may have a capacitance of about 100 nF, 1 μF, 10 μF, 100 μF, 1 mF or more. The first powered crowbar circuit 130 may have a low inductance such as, for example, an inductance less than about 100 nH.

The energy storage capacitor 131, for example, may be coupled across the DC power supply 133. The DC power supply 133 may provide a voltage or charge to the energy storage capacitor 131 that blocks return current that may flow from the sample 180 through second electrode 172 back to the first pulser 110. In one example, the DC power supply 133 may provide a voltage that is less than (e.g., about one half) the voltage provided by the DC power supply 115 or less than (e.g., about one half) about half the voltage amplitude of the pulses produced by the first pulser 110. As another example, the DC power supply 133 may have a polarity that is opposite the polarity of the first pulser 110 or the DC power supply 125.

The first pulser 110 may be electrically coupled with a first transformer 150. The first transformer 150 may be electrically coupled across the output of the first pulser 110 and across the first powered crowbar circuit 130.

The first transformer 150, for example, may have a plurality of primary windings wound around a core and on or more secondary winding wound around the core. The output of the first pulser 110 may be coupled with the primary windings of the first transformer 150. The secondary winding of the first transformer 150 may have a positive end and a negative end. The anode of a first secondary-side diode 161 may be electrically coupled with the positive end of the secondary winding. The cathode of a second diode 162 may be electrically coupled with the negative end of the secondary winding.

The first electrode 171 may be electrically coupled with the cathode of the first secondary-side diode 161. The second electrode 172 may be electrically coupled the anode of the second diode 162. In operation, the charges present on the first electrode 171 and the second electrode 172 may have opposite polarities.

The second powered crowbar circuit 140, for example, may be disposed across the output of the second pulser 120. The second powered crowbar circuit 140, for example, may be disposed across the primary windings of the second transformer 155. The second powered crowbar circuit 140, for example, may include a DC power supply 143, a crowbar diode 142, and an energy storage capacitor 141 arranged in series. The anode of the diode 142 may be electrically coupled with the collector of the second switch module 122 and the cathode of the crowbar diode 142 may be electrically coupled with the energy storage capacitor 141. The energy storage capacitor 141, for example, may have a capacitance of about 100 nF, 1 μF, 10 μF, 100 μF, 1 mF or more. The second powered crowbar circuit 130 may have a low inductance such as, for example, an inductance less than about 100 nH.

The energy storage capacitor 141, for example, may be coupled across the DC power supply 143. The DC power supply 143 may provide a voltage to the energy storage capacitor 141 that blocks return current that may flow from the sample 180 through the third electrode 173 and/or the fourth electrode 174 back to the second transformer 155. In one example, the DC power supply 143 may provide a voltage that is less than (e.g., about one half) the voltage provided by the DC power supply 125. In another example, the DC power supply 143 may provide a voltage that is about equal to the voltage provided by the energy storage capacitor 124. As another example, the DC power supply 133 may have a polarity that is opposite the polarity of the first pulser 110 or the DC power supply 125.

The second pulser 120 may be electrically coupled with a second transformer 155. The second transformer 155 may be electrically coupled across the output of the second pulser 120 and across the second powered crowbar circuit 140.

The second transformer 155, for example, may have a plurality of primary windings wound around a core and plurality of secondary winding wound around the core. The output of the second pulser 120 may be coupled with the plurality of primary windings. The secondary winding may have a first end and a second end.

The third electrode 173 may be electrically coupled with the first end of the secondary winding of the second transformer 155 such as, for example, the anode of the third electrode 173 may be coupled with first end of the secondary winding of the second transformer 155. The fourth electrode 174 may be electrically coupled with the second end of the secondary winding of the second transformer 155 such as, for example, the cathode of the fourth electrode 174 may be coupled with second end of the secondary winding of the second transformer 155.

Each electrode of the plurality of the electrodes may be coupled with a diode of the power supply system that allows current to flow in one direction into and out of the sample 180 through. Some of the electrodes of the plurality of the electrodes may be coupled with a diode with a different polarity than the other diodes.

The third secondary-side diode 163 is coupled with a first end of the second transformer 155. The third secondary-side diode 163, for example, may also be coupled with the third electrode 173. The third secondary-side diode 163, for example, may have the same polarity as first secondary-side diode 161. The third secondary-side diode 163, for example, may have a polarity that allows current to flow from the first transformer 150 to the sample 180 via first electrode 171.

In this example, the fourth secondary-side diode 164 may be coupled with a second end of the second transformer 155. The fourth secondary-side diode 164 may, for example, may be coupled with first electrode 171. The fourth secondary-side diode 164 may, for example, have a polarity that is the same as the second diode 162. The fourth secondary-side diode 164, for example, may allow current to flow from sample 180 via first electrode 171 to the second transformer 155 as the second transformer 155 defluxes.

The fifth secondary-side diode 165 is coupled with a second end of the second transformer 155. The fifth secondary-side diode 165 may, for example, have a polarity that is opposite the polarity of the third secondary-side diode 163. The fifth secondary-side diode 165 may, for example, have a polarity that is the same as the second diode 162. The fifth secondary-side diode 165 may, for example, allow current to flow from sample 180 via second electrode 172 to the second transformer 155 as the second transformer 155 defluxes.

The sixth secondary-side diode 166 is coupled with a second end of the second transformer 155. The sixth secondary-side diode 166, for example, may also be coupled with the fourth electrode 174. The sixth secondary-side diode 166 may, for example, have a polarity that is opposite the polarity of the third secondary-side diode 163. The sixth secondary-side diode 166 may, for example, have a polarity that is the same as the second diode 162. The sixth secondary-side diode 166 may, for example, allow current to flow from sample 180 via the fourth electrode 174 to the second transformer 155 as the second transformer 155 defluxes.

Each electrode of the plurality of the electrodes, for example, may be coupled together as part of a single catheter. A subset of the electrodes of the plurality of the electrodes, for example, may be coupled together as part of a single catheter. Each electrode of the plurality of the electrodes, for example, may be separate and/or distinct electrodes.

When the first pulser 110 is pulsing, a positive pulse is produced on the first electrode 171 and a negative pulse is produced on the second electrode 172. When the first pulser 110 is pulsing and the second pulser 120 is not pulsing, the second powered crowbar circuit 140, which is coupled with the second pulser 120, may block current from flowing from the first pulser 110, through the sample 180, through the fourth electrode 174, through second transformer 155, and back to the second pulser 120. Instead, a charge may be created across energy storage capacitor 141 by the DC power supply 143 may block current from flowing back into the second pulser 120. The energy storage capacitor 141 and the DC power supply 143 comprise a DC source. The charge created on the energy storage capacitor 141 by the DC power supply 143, for example, may be less than the voltage produced at the first electrode 171.

When the second pulser 120 is pulsing, a positive pulse is produced on the third electrode 173, a negative pulse is produced on the fourth electrode 174. When the second pulser 120 is pulsing and the first pulser 110 is not pulsing, the first powered crowbar circuit 130, which is coupled with the first pulser 110, blocks current from flowing from the second pulser 120, through the sample 180, through the second electrode 172, through transformer 150, and back to the first pulser 110. Instead, a charge created across an energy storage capacitor 131 by the DC power supply 133 may effectively block current from flowing back into the first pulser 110. The energy storage capacitor 131 and the DC power supply 133 comprise a DC source. The charge created on the energy storage capacitor 131 by the DC power supply 133, may be less than the voltage produced at the fourth electrode 174.

A relationship may be established between the voltage produced by the first switch module 112 ($V_1$), the voltage produced by DC power supply 133 ($V_2$), the pulse turn on time of the first switch module 112 ($T_1$), and the pulse turn off time from the first switch module 112 ($T_1$). The relationship, for example, may be $|V_1|T_1 \leq |V_2|T_2$. This may allow, for example, for faster pulse repetition frequencies and/or for positive going pulses followed by negative going pulses.

Figure 2A:
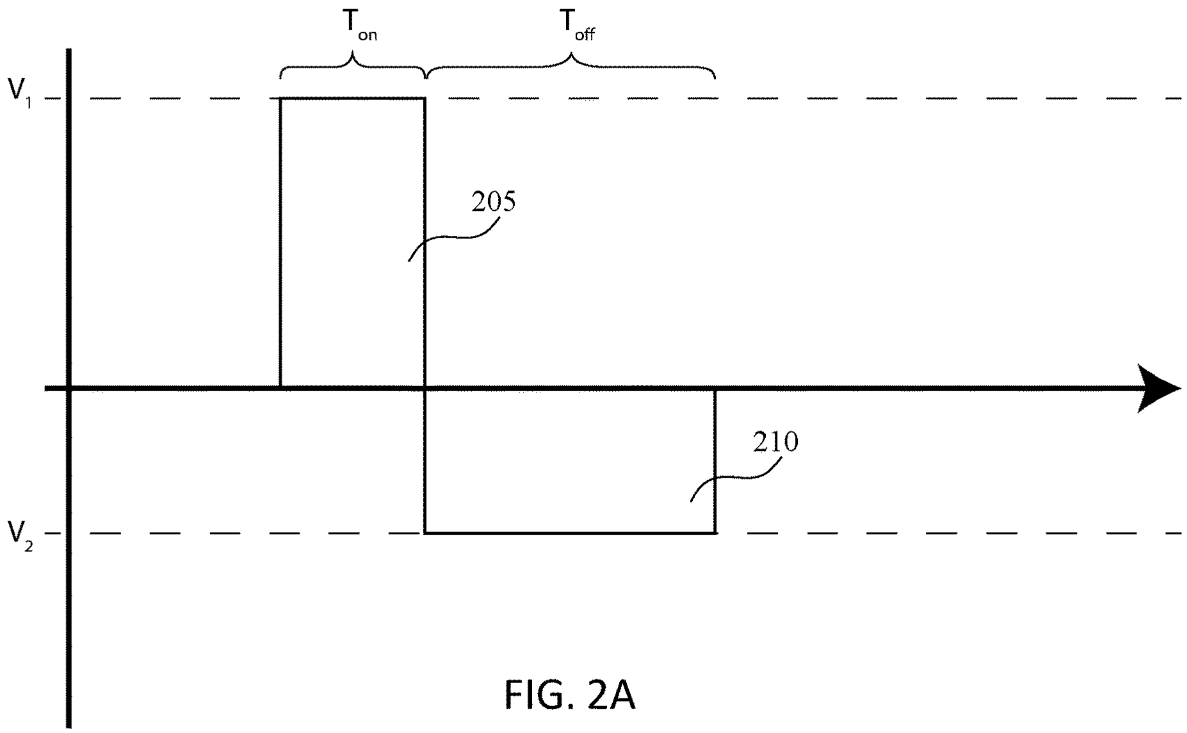
FIG. 2A shows an example voltage waveform at a transformer using the pulsing power supply system.

FIG. 2A shows an example first pulse 205 measured on the first transformer 150 during a first pulse using the first pulser 110. The first pulse has a voltage of $V_1$ on the transformer 150 and a pulse width of $T_1$. A second pulse 210, which has the opposite polarity as the first pulse, is created by the core of the transformer 150 defluxing from magnetizing current flowing from the first transformer core up the first powered crowbar circuit 130, which creates a negative voltage on the core from the DC power supply 133 resulting in the second pulse 210. The second pulse has a voltage $V_2$ on the transformer 150 from the DC power supply 133 and a pulse width of $t_2$. During the second pulse, the voltage $V_2$ should be set as $V_2 = -\frac{1}{2}V_1$, and the second pulse width, or the time the pulser is not pulsing, is $T_2 = -2T_1$. In this example, the relationship $|V_1|T_1 \leq |V_2|T_2$ holds.

Figure 2B:
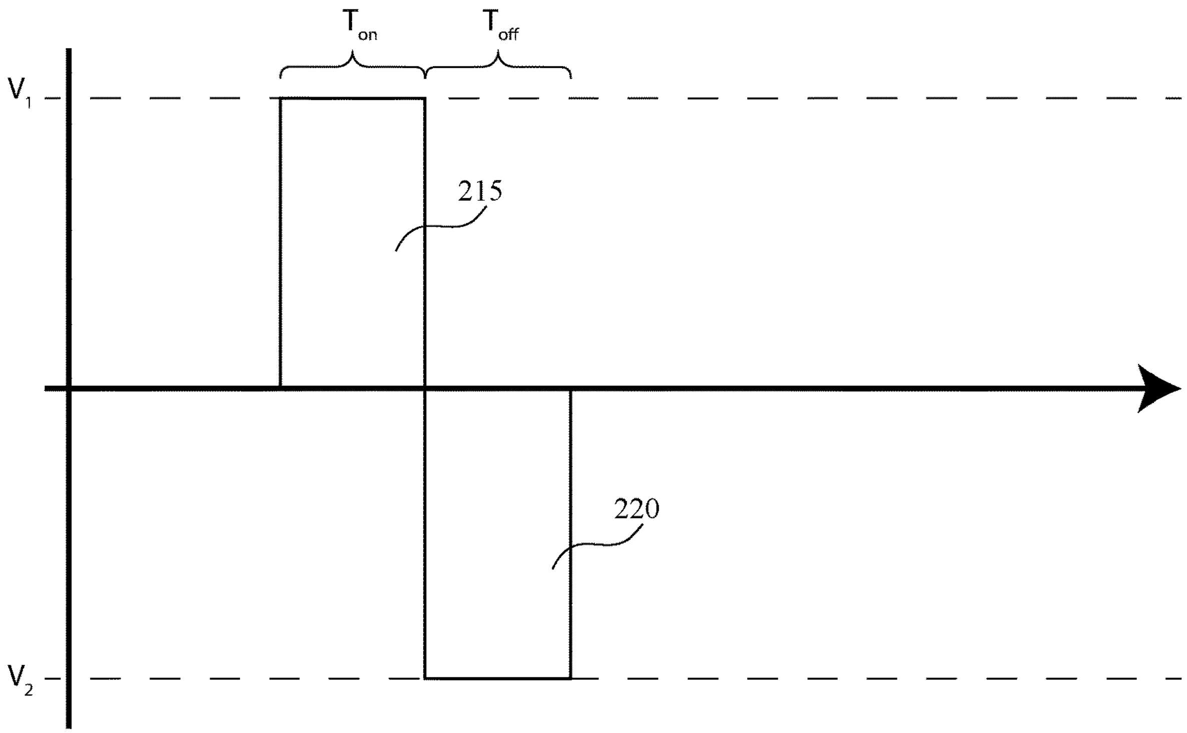
FIG. 2B shows an example voltage waveform at a transformer using the pulsing power supply system.

FIG. 2B shows another example first pulse 215 measured on the first transformer 150 during a first pulse using the first pulser 110. A second pulse 220 is created by the core of the transformer defluxing from magnetizing current flowing from the first transformer core up the first powered crowbar circuit 130, which creates a negative voltage on the core from the DC power supply 133 resulting in second pulse 220. During the first pulse, the voltage on the first transformer 150 is $V_1$ and the pulse width is $T_1$. During the second pulse, the voltage on the first transformer 150 is the voltage of the DC power supply 133, which in this case is $V_2 = -V_1$, and the pulse width is about the same $T_2 = -2T_1$. Having a higher voltage for the DC power supply 133, for example, allows for a faster pulse repetition frequency and shorter pulse width. In this example, the relationship $|V_1|T_1 \leq |V_2|T_2$ holds.

Similar pulses can be created at the second transformer 155 as those shown in FIG. 2A and FIG. 2B. The pulses shown in FIG. 2A and FIG. 2B are not the pulses produced at the electrodes. For instance, the second pulse 210 the second pulse 220 (the negative pulse) in both figures is not produced at the electrodes.

Figure 3:
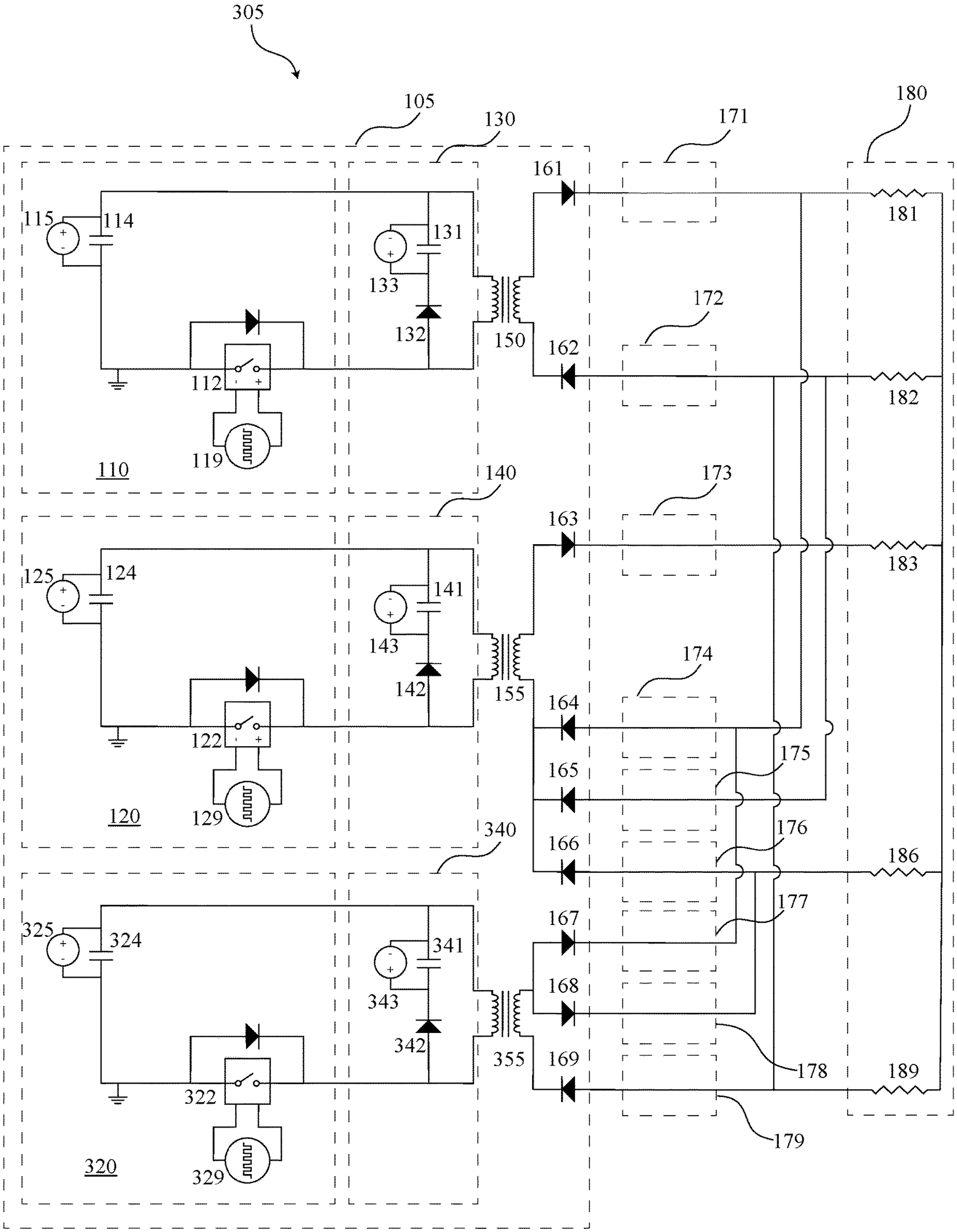
FIG. 3 is an example circuit diagram of a pulsing power supply system.

FIG. 3 is an example circuit diagram of a pulsing power supply system 305 coupled with a plurality of the electrodes, 179. In this example, the inherent resistance of the sample 180 may be represented by resistors 181, 182, 183, 184, 185.

The pulsing power supply system 305 includes the first pulser 110, the second pulser 120, and a third pulser 320. The third pulser 320, for example, may have the same or similar components as the first pulser 110 and/or the second pulser 120. The third pulser 320 may be coupled with a third powered crowbar 340 and third transformer 355. The third pulser 320 may be coupled with a third transformer 355.

The third pulser 320, for example, can include a third switch module 322 with one or more solid state switches (e.g., IGBTs, a MOSFETs, a SiC MOSFETs, SiC junction transistors, FETs, SiC switches, GaN switches, photoconductive switches, etc.). One or more solid state switches and or circuits can be arranged in parallel or series. The third switch module 322 may be coupled with a DC source such as, for example, an energy storage capacitor 324 coupled with a power supply 325. The third switch module 322, for example, may be opened or closed based on timing signals from control source 329, which may or may not be different from the timing provided to third switch module 322 provided by control source 329.

The third powered crowbar 340, for example, may be disposed across the output of the third pulser 320. The third powered crowbar 340, for example, may be disposed across the primary windings of the third transformer 355. The third powered crowbar 340, for example, may include crowbar diode 342 and a DC source arranged in series. The DC source may include the energy storage capacitor 341 and the DC power supply 343. The anode of the crowbar diode 342 may be electrically coupled with the cathode of the crowbar diode 342 may be electrically coupled with the diode third switch module 322. The energy storage capacitor 341, for example, may have a capacitance of about 100 nF, 1 μF, 10 μF, 100 μF, 1 mF or more. The third powered crowbar 340 may have a low inductance such as, for example, an inductance less than about 100 nH.

The third pulser 320 may be electrically coupled with a third transformer 355. The third transformer 355 may be electrically coupled across the output of the third pulser 320 and across the third powered crowbar 340.

A first end of the secondary side of the third transformer 355 may be coupled with seventh secondary-side diode 167 and/or with eighth secondary-side diode 168. The polarity of seventh secondary-side diode 167 and/or eighth secondary-side diode 168 may be the same as first secondary-side diode 161 and/or third secondary-side diode 163. The seventh secondary-side diode 167, for example, may be coupled with fourth secondary-side diode 164. The eighth secondary-side diode 168, for example, may be coupled with second diode 162.

The fifth electrode 175 may be electrically coupled with a second end of the secondary winding of the third transformer 355 such as, for example, the fifth electrode 175 may be coupled with second end of the secondary winding of the third transformer 355 via ninth secondary-side diode 169.

When the third pulser 320 is pulsing a negative pulse is produced on the fifth electrode 175. When the third pulser 320 is pulsing and the first pulser 110 is not pulsing, the first powered crowbar circuit 130, which is coupled with the first pulser 110, blocks current from flowing from the third pulser 320, through the sample 180, through the second electrode 172, through the transformer 150, and back to the first pulser 110. Instead, a charge created across the energy storage capacitor 131 by the DC power supply 133, for example, may block current from flowing back into the first pulser 110. The voltage on the energy storage capacitor 131 produced by the DC power supply 133 may be less than the voltage produced at the fourth electrode 174.

When the third pulser 320 is pulsing and the second pulser 120 is not pulsing, the second powered crowbar circuit 140, which is coupled with the second pulser 120, blocks current from flowing from the third pulser 320, through the sample 180, through fourth electrode 174, through the second transformer 155, and back to the second pulser 120. Instead, a charge created across the energy storage capacitor 141 by the DC power supply 143, for example, may block current from flowing back into the second pulser 120. The charge created on the energy storage capacitor 141, by the DC power supply 143, may be less than (e.g., about one half) the voltage produced at the first electrode 171.

FIGS. 4, 5, 6, 7, and 8 show example waveforms using the pulsing power supply system shown in FIG. 1.

Figure 4:
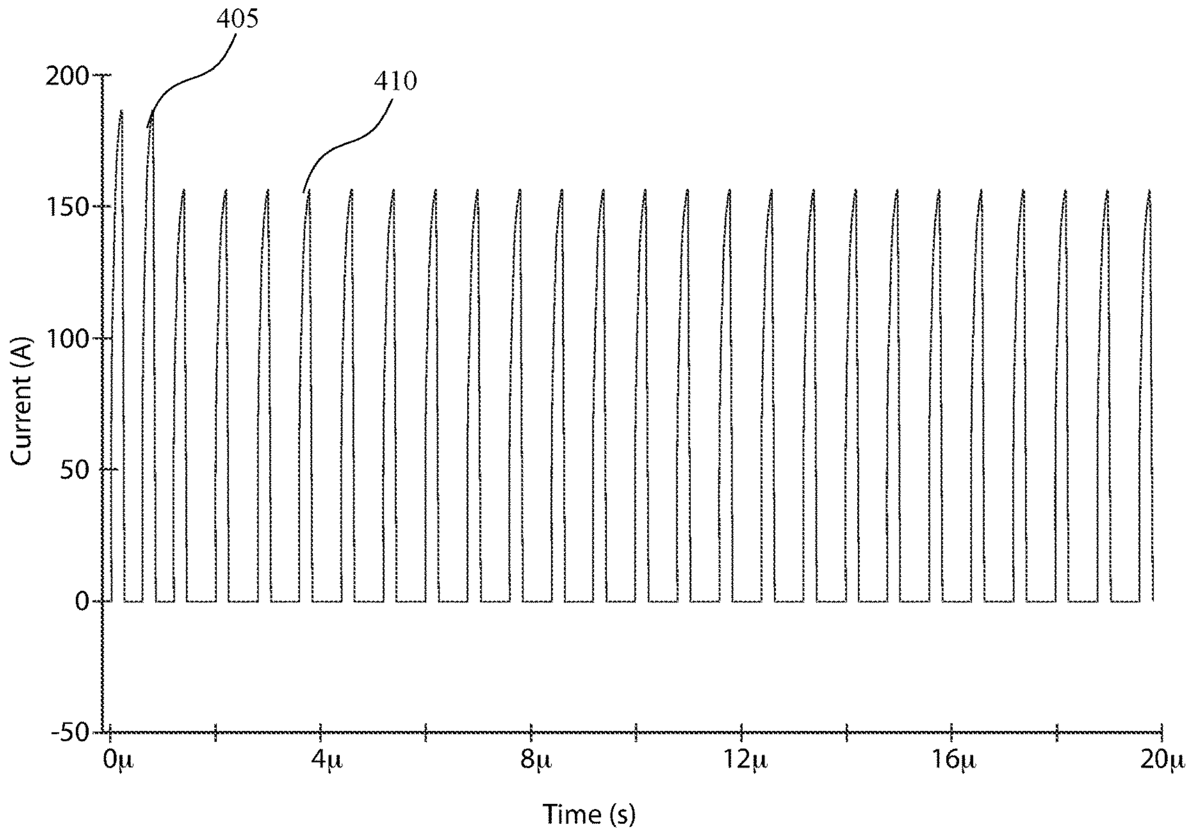
FIG. 4 is an example diagram of waveforms.

FIG. 4 is an example diagram of a waveform 405 showing the current leaving the first transformer 150 and a waveform 410 showing the current leaving the second transformer 155. In this example, two pulses were created by the first pulser 110 followed by twenty pulses created by the second pulser 120.

Figure 5:
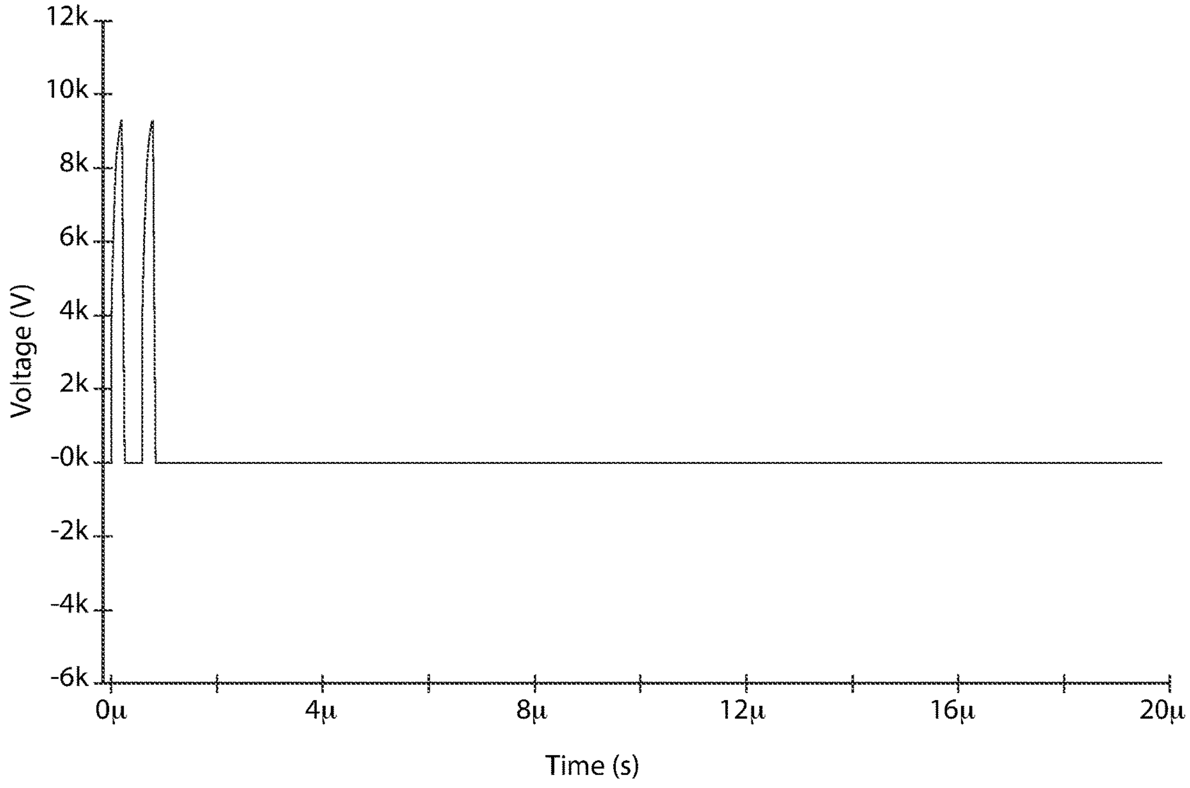
FIG. 5 is an example diagram of waveforms.

FIG. 5 is an example diagram of a voltage waveform produced at first electrode 171.

Figure 6:
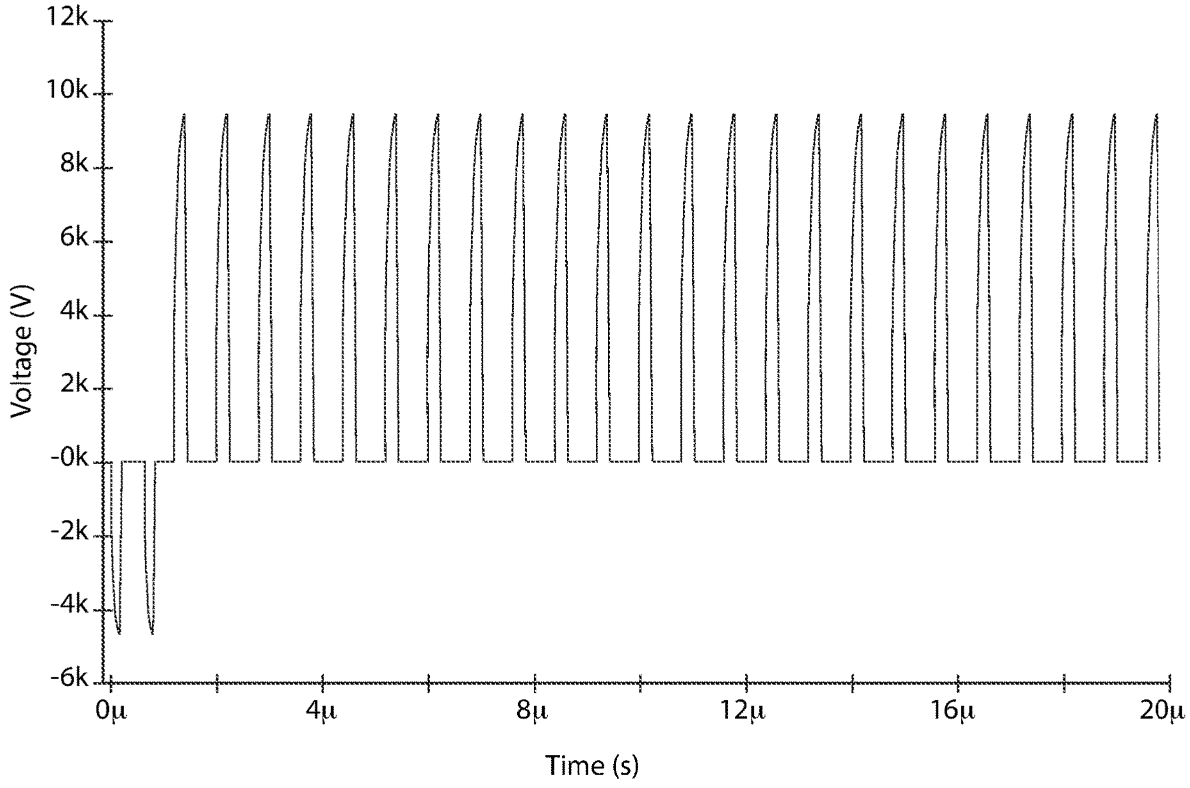
FIG. 6 is an example diagram of waveforms.

FIG. 6 is an example diagram of a voltage waveform produced at second electrode 172. Note that the negative voltage is produced when the first pulser 110 is pulsing and the positive voltage is produced when the second pulser 120 is pulsing.

Figure 7:
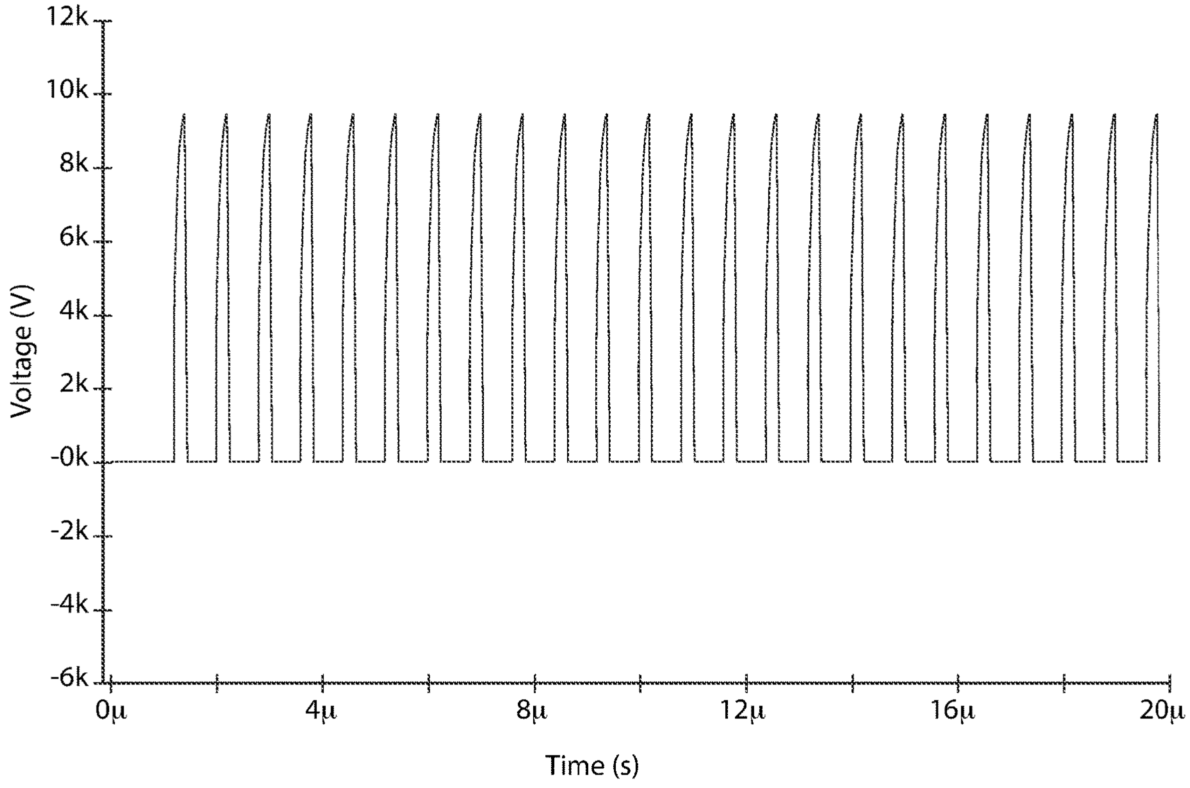
FIG. 7 is an example diagram of waveforms.

FIG. 7 is an example diagram of a voltage waveform produced at third electrode 173. As shown, no voltage is produced when the first pulser 110 is pulsing.

Figure 8:
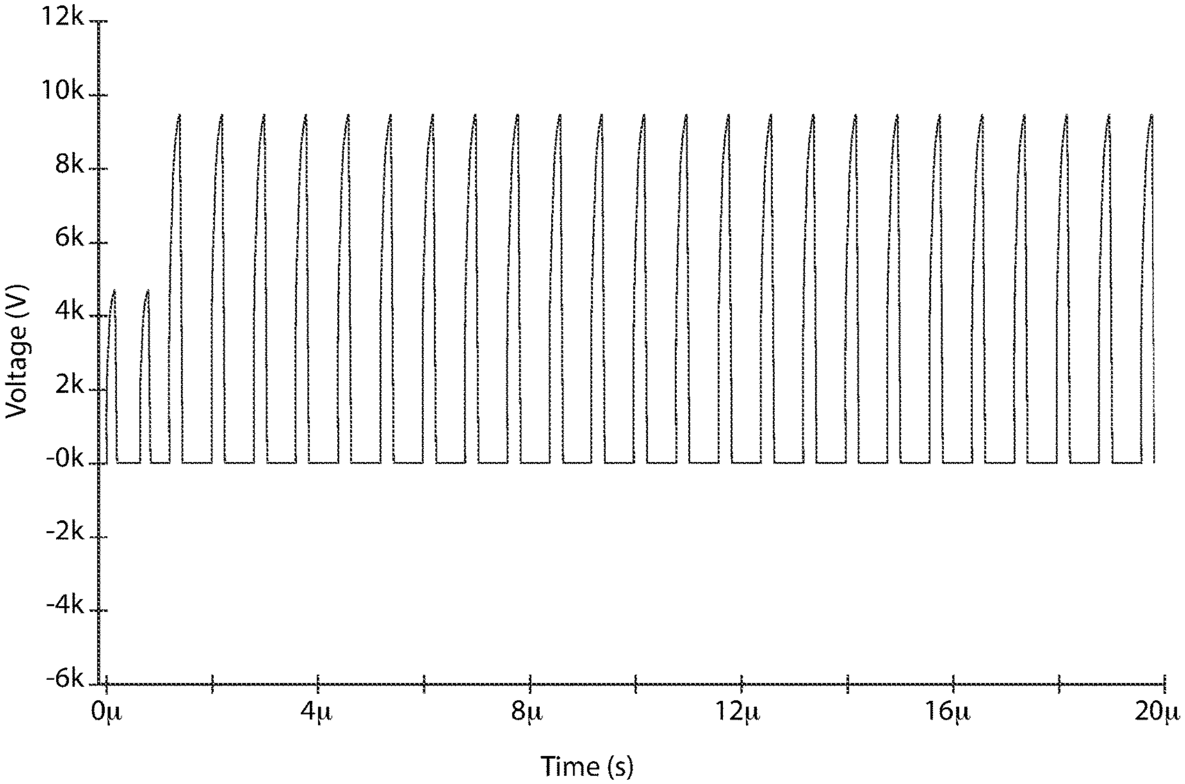
FIG. 8 is an example diagram of waveforms.

FIG. 8 is an example diagram of a voltage waveform produced at the fourth electrode 174.

Figure 9:
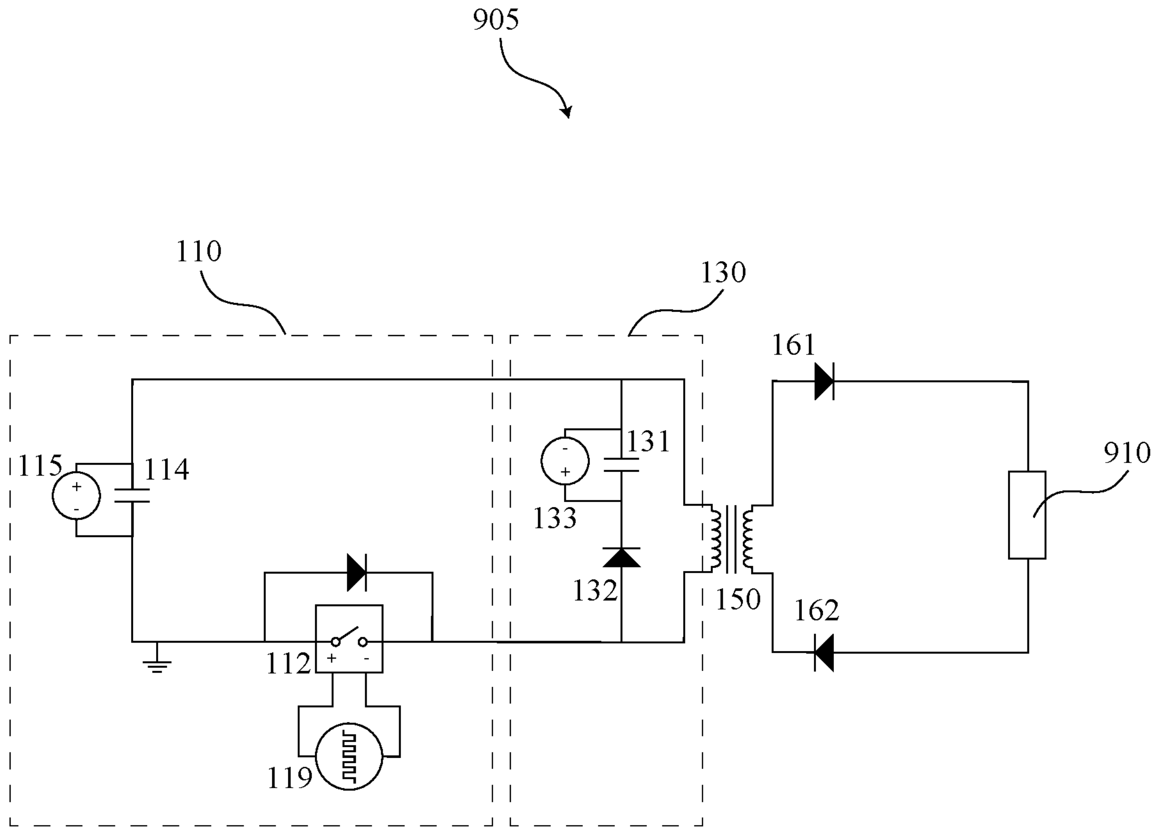
FIG. 9 is an example circuit diagram of a pulsing power supply system with a load.

FIG. 9 is an example circuit diagram of a pulsing power supply system 905 with a load 910. In this example, the pulsing power supply system 905 is similar to the pulsing power supply system 105 with the electrodes replaced by a load 910. In this example, the primary side of the first transformer 150 is arranged across both the first pulser 110 and the first powered crowbar circuit 130 as shown and discussed in regard to the pulsing power supply system 105 discussed above in regard to FIG. 1. A load 910 is arranged across the secondary-side of the first transformer 150. The load 910 may include any type of load including, for example, a capacitive load, a resistive load, and/or an inductive load. While first secondary-side diode 161 and second diode 162 are shown, these may or may not be used. The diode 161 and/or second diode 162 may or may not be used.

Figure 10:
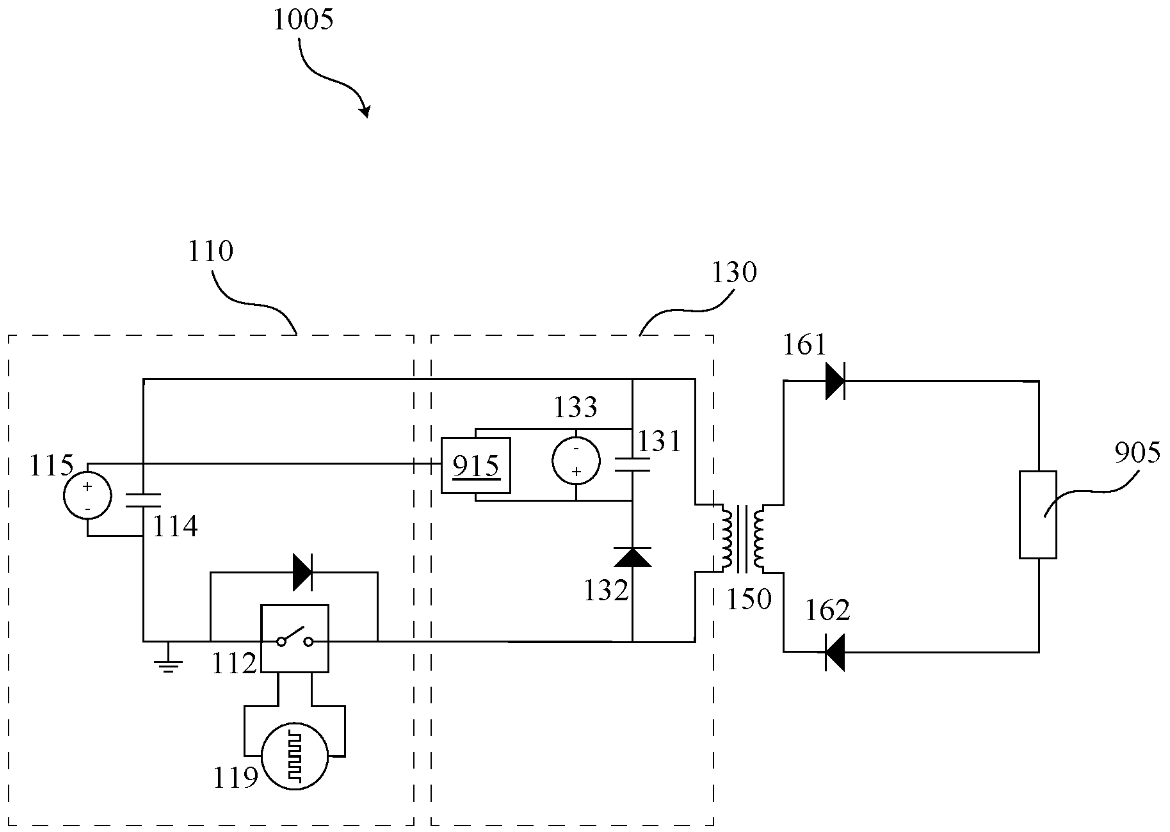
FIG. 10 is an example circuit diagram of a pulsing power supply system with an energy recovery circuit.

FIG. 10 is an example circuit diagram of a pulsing power supply system 1005 with an energy recovery circuit 915. In this example, the pulsing power supply system is similar to the pulsing power supply system 905 shown in FIG. 9. In this example, the DC power supply 133 is coupled with an energy recovery circuit 915. The energy recovery circuit 915, for example, may include a rectifier, DC converter, and/or one or more diodes. The energy recovery circuit 915, for example, may allow charge on the energy storage capacitor 131 from defluxing the first transformer 150 to charge the energy storage capacitor 114. The diode 161 and/or second diode 162 may or may not be used.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The conjunction "or" is inclusive.

The terms "first", "second", "third", etc. are used to distinguish respective elements and are not used to denote a particular order of those elements unless otherwise specified or order is explicitly described or required.

Numerous specific details are set forth to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Embodiments of the methods disclosed may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A pulsing power supply system comprising:

a pulser having an output that outputs pulses greater than 5 kV with a pulse repetition frequency greater than 10 kHz;

a powered crowbar circuit electrically coupled across the output, the powered crowbar circuit includes a DC source and a diode arranged in series, a polarity of the DC source is arranged opposite a polarity of the pulser;

a transformer having a primary side and a secondary side, the primary side of the transformer is electrically coupled across the output of the pulser and across the powered crowbar circuit; and a one or more electrodes electrically coupled with the secondary-side of the transformer.

2. The pulsing power supply system according to claim 1, further comprising one or more diodes electrically coupled with respective ones of the one or more electrodes.

3. The pulsing power supply system according to claim 1, further comprising:

a second pulser having a second output that outputs pulses greater than 5 kV with a pulse repetition frequency greater than 10 kHz;

a second powered crowbar circuit electrically coupled across the second output, the second powered crowbar circuit including a DC source;

a second transformer having a primary side and a secondary side, the primary side of the second transformer is electrically coupled across the output of the second pulser and across the second powered crowbar circuit; and a second one or more electrodes electrically coupled with the secondary-side of the second transformer.

4. The pulsing power supply according to claim 1, wherein the inductance of the powered crowbar circuit is less than about 100 nH.

5. The pulsing power supply according to claim 1, wherein the pulser outputs pulses with a voltage $V_1$, a pulse width of $T_1$, and a pulse turn off time of $T_2$, and the voltage of the DC source outputs a voltage $V_2$, wherein $|V_1|T_1 \leq |V_2|T_2$.

6. The pulsing power supply according to claim 1, wherein the DC source comprises an energy storage capacitor and a DC power supply.

7. The pulsing power supply according to claim 1, further comprising an energy recovery circuit electrically coupled with the powered crowbar circuit and a DC power source of the pulser.

8. A pulsing power supply comprising:

a pulser having an output that outputs pulses greater than 5 kV with a pulse repetition frequency greater than 10 kHz;

a transformer having a primary side and a secondary side, the secondary-side having a first end and a second end; and a powered crowbar circuit electrically coupled across the output of the pulser and across the primary side of the transformer, the powered crowbar circuit comprising:

a DC source; and a crowbar diode having an anode.

9. The pulsing power supply according to claim 8, wherein a polarity of the DC source is arranged opposite a polarity of the pulser.

10. The pulsing power supply according to claim 8, wherein the inductance of the powered crowbar circuit is less than about 100 nH.

11. The pulsing power supply according to claim 8, wherein the pulser outputs pulses with a voltage $V_1$, a pulse width of $T_1$, and a pulse turn off time of $T_2$, and the voltage of the DC source outputs a voltage $V_2$, wherein $|V_1|T_1 \leq |V_2|T_2$.

12. The pulsing power supply according to claim 8, wherein the DC source comprises an energy storage capacitor and a DC power supply.

13. The pulsing power supply according to claim 8, further comprising a first secondary-side diode electrically coupled with the first end of the secondary-side of the transformer.

14. The pulsing power supply according to claim 13, further comprising an electrode electrically coupled with the first secondary-side diode.

15. The pulsing power supply according to claim 13, further comprising a secondary-side diode electrically coupled with the second end of the secondary-side of the transformer, the secondary-side diode has a polarity opposite a polarity of the first secondary-side diode.

16. The pulsing power supply according to claim 15, further comprising a second electrode electrically coupled with the secondary-side diode.

17. The pulsing power supply according to claim 8, further comprising an energy recovery circuit electrically coupled with the powered crowbar circuit and a DC power source of the pulser.

18. A pulsing power supply comprising:

a pulser having an output with a voltage $V_1$ that outputs pulses with a voltage greater than 5 kV, a pulse width of $T_1$, and a pulse turn off time of $T_2$;

a powered crowbar circuit electrically coupled across the output, the powered crowbar circuit including a DC source having a voltage $V_2$; and a transformer having a primary side and a secondary side, the primary side of the transformer is electrically coupled across the output of the pulser and across the powered crowbar circuit;

wherein $|V_1|T_1 \leq |V_2|T_2$.

19. The pulsing power supply according to claim 18, wherein the inductance of the powered crowbar circuit is less than about 100 nH.

20. The pulsing power supply according to claim 18, wherein the powered crowbar circuit comprises:

a capacitor arranged across the DC source; and a crowbar diode having an anode electrically coupled with the pulser.

21. The pulsing power supply according to claim 18, further comprising:

a first plurality of electrodes electrically coupled with the secondary-side of the first transformer; and a second plurality of electrodes electrically coupled with the secondary-side of the second transformer.

22. The pulsing power supply according to claim 18, wherein a polarity of the DC source is arranged opposite a polarity of the pulser.

23. The pulsing power supply according to claim 18, wherein the DC source comprises an energy storage capacitor and a DC power supply.

24. The pulsing power supply according to claim 18, further comprising an energy recovery circuit electrically coupled with the powered crowbar circuit and a DC power source of the pulser.

* * * * *